(12) United States Patent
Wenham et al.

(10) Patent No.: US 9,508,884 B2
(45) Date of Patent: Nov. 29, 2016

(54) SOLAR CELL METALLISATION AND INTERCONNECTION METHOD

(71) Applicant: NewSouth Innovations Pty Limited, UNSW Sydney, NSW (AU)

(72) Inventors: Stuart Ross Wenham, Cronulla (AU); Matthew Bruce Edwards, Elanora Heights (AU); Alison Joan Lennon, Rozelle (AU); Pei Chieh Hsiao, Wollstonecraft (AU); Budi Santoso Tjahjono, Wujie Township, Yilan County (TW)

(73) Assignee: NEWSOUTH INNOVATIONS PTY LIMITED, Sydney, NSW (AU)

( * ) Notice: Subject to any disclaimer, the term of this patent is extended or adjusted under 35 U.S.C. 154(b) by 0 days.

(21) Appl. No.: 14/764,128

(22) PCT Filed: Jan. 30, 2014

(86) PCT No.: PCT/AU2014/000058
§ 371 (c)(1),
(2) Date: Jul. 28, 2015

(87) PCT Pub. No.: WO2014/117216
PCT Pub. Date: Aug. 7, 2014

(65) Prior Publication Data
US 2016/0005903 A1 Jan. 7, 2016

(30) Foreign Application Priority Data

Jan. 31, 2013 (AU) ............................... 2013900310
Feb. 4, 2013 (AU) ............................... 2013900351

(51) Int. Cl.
*H01L 31/00* (2006.01)
*H01L 31/05* (2014.01)
(Continued)

(52) U.S. Cl.
CPC ............ *H01L 31/0508* (2013.01); *C25D 3/60* (2013.01); *C25D 5/10* (2013.01); *C25D 5/50* (2013.01);
(Continued)

(58) Field of Classification Search
None
See application file for complete search history.

(56) References Cited

U.S. PATENT DOCUMENTS 6,156,967 A * 12/2000 Ralph ................... H01L 31/048
136/244
8,574,951 B1 * 11/2013 Wang ................ H01L 31/02168
136/256

(Continued)

FOREIGN PATENT DOCUMENTS

CN 102132423 7/2011
CN 202332869 7/2012

(Continued)

OTHER PUBLICATIONS

Notification of the First Office Action and Search Report (English Translation); Chinese Patent Application No. 2014800186263; Issue Date Jun. 17, 2016; 9 pages.

Primary Examiner — Evren Seven

(57) ABSTRACT

A solar cell and a method of forming a contact structure on a solar cell having a p-n junction formed between a first semiconductor region of a first dopant polarity and a second semiconductor region of a second dopant polarity opposite to the first dopant polarity. The method comprises: forming a plurality of contact points on a surface of the solar cell, whereby the contact points provide an electrical connection to the first semiconductor region; and locating a plurality of conducting wires over the solar cell to make electrical connection to the contact points. The contact points are either an exposed silicon surface or a silicon surface over which metal pads are formed. The metal pads may comprise a plated layer of a low-melting temperature metal and/or may have a thickness of less than 5 microns.

24 Claims, 11 Drawing Sheets

(51) Int. Cl.
*H01L 31/0224* (2006.01)
*H01L 31/068* (2012.01)
*H01L 31/18* (2006.01)
*C25D 3/60* (2006.01)
*C25D 5/10* (2006.01)
*C25D 5/50* (2006.01)
*C25D 5/56* (2006.01)
*C25D 7/12* (2006.01)
*H01L 31/02* (2006.01)
*H01L 31/0203* (2014.01)
*C25D 5/00* (2006.01)

(52) U.S. Cl.
CPC ............... *C25D 5/505* (2013.01); *C25D 5/56* (2013.01); *C25D 7/12* (2013.01); *H01L 31/0203* (2013.01); *H01L 31/02021* (2013.01); *H01L 31/022425* (2013.01); *H01L 31/0516* (2013.01); *H01L 31/068* (2013.01); *H01L 31/0682* (2013.01); *H01L 31/1804* (2013.01); *C25D 5/006* (2013.01); *Y02E 10/547* (2013.01); *Y02P 70/521* (2015.11)

(56) References Cited

U.S. PATENT DOCUMENTS

| | | | |
|---|---|---|---|
| 8,642,378 B1 * | 2/2014 | Fogel | H01L 31/0376 136/252 |
| 2005/0022857 A1 * | 2/2005 | Daroczi | H01L 31/0516 136/244 |
| 2007/0095384 A1 * | 5/2007 | Farquhar | H01L 31/022441 136/244 |
| 2008/0092944 A1 | 4/2008 | Rubin | |
| 2008/0210294 A1 * | 9/2008 | Moslehi | H01L 31/042 136/251 |
| 2009/0183768 A1 * | 7/2009 | Wenham | H01L 31/022425 136/256 |
| 2009/0314341 A1 * | 12/2009 | Borden | H01L 31/022425 136/256 |
| 2010/0059109 A1 * | 3/2010 | Nakayashiki | H01L 31/022425 136/255 |
| 2010/0154876 A1 * | 6/2010 | Camalleri | H01L 31/182 136/255 |
| 2010/0319770 A1 | 12/2010 | Lee et al. | |
| 2011/0201188 A1 * | 8/2011 | Gupta | H01L 21/2254 438/530 |
| 2011/0277817 A1 * | 11/2011 | Ide | H01L 31/022441 136/246 |
| 2012/0088327 A1 | 4/2012 | Brand et al. | |
| 2012/0171804 A1 * | 7/2012 | Moslehi | B23K 26/073 438/71 |
| 2012/0204928 A1 | 8/2012 | Kutzer et al. | |
| 2012/0214270 A1 * | 8/2012 | Stockum | H01L 31/02168 438/71 |
| 2012/0270359 A1 * | 10/2012 | Kumar | H01L 31/02363 438/71 |
| 2012/0282722 A1 | 11/2012 | Wenham et al. | |
| 2013/0056044 A1 * | 3/2013 | Ravi | H01L 31/048 136/245 |
| 2013/0087189 A1 * | 4/2013 | Graff | H01L 21/266 136/256 |
| 2013/0112233 A1 * | 5/2013 | Coakley | H01L 31/022441 136/244 |
| 2013/0153025 A1 * | 6/2013 | Hahn | H01L 31/02366 136/256 |
| 2013/0240023 A1 * | 9/2013 | Sewell | H01L 31/022441 136/251 |
| 2013/0255777 A1 * | 10/2013 | Lee | H01L 31/02167 136/259 |
| 2013/0263908 A1 * | 10/2013 | Zhu | H01L 31/022425 136/244 |
| 2013/0291924 A1 * | 11/2013 | Hamamoto | H01L 31/022425 136/244 |
| 2013/0321013 A1 * | 12/2013 | Pisklak | H02S 50/00 324/750.3 |
| 2013/0329526 A1 * | 12/2013 | Rakib | H02J 3/385 367/197 |
| 2014/0000691 A1 * | 1/2014 | Papa Rao | H01L 31/02168 136/256 |
| 2014/0061531 A1 * | 3/2014 | Faur | H01L 31/068 252/79.3 |
| 2014/0174526 A1 * | 6/2014 | Pawlak | H01L 31/022441 136/256 |
| 2014/0179056 A1 * | 6/2014 | Morse | H01L 31/022425 438/97 |
| 2014/0182652 A1 * | 7/2014 | Song | H01G 9/2068 136/244 |
| 2014/0352753 A1 * | 12/2014 | Degroot | H01L 31/0504 136/244 |
| 2015/0068592 A1 * | 3/2015 | Kommera | H01L 31/0201 136/256 |
| 2015/0140725 A1 * | 5/2015 | Scardera | H01L 31/0201 438/98 |
| 2015/0318428 A1 * | 11/2015 | Voss | H01L 31/0508 136/244 |

FOREIGN PATENT DOCUMENTS

| | | |
|---|---|---|
| CN | 102881756 | 1/2013 |
| JP | 2003142703 | 5/2003 |
| KR | 1020120041437 | 5/2012 |
| WO | WO 2006/130910 | 12/2006 |

* cited by examiner

SOLAR CELL METALLISATION AND INTERCONNECTION METHOD

INTRODUCTION

The present invention relates to the manufacture of photovoltaic devices and in particular the invention provides an improved method of forming contacts on such devices.

BACKGROUND

One of the key requirements in the reduction of the cost of ownership of silicon solar cells is the fabrication of high efficiency cell features at low cost. Standard industrial solar cell manufacture traditionally utilises a homogeneously heavily doped top surface emitter layer to separate charge carriers within a solar cell, transport carriers laterally to the front cell metal contacts and provide low resistance ohmic contact to these metal contacts. In contrast, a solar cell having a selective emitter utilises selectively heavily doped regions under the metal contacts while the surrounding top surface layer is comparatively lightly doped. This allows for low recombination in the lightly doped surface region, increasing the response of the cell to short wavelength light, in turn improving the short circuit current and open circuit voltage of the cell. Meanwhile, the heavily doped regions under the cell contacts reduce recombination at the metal-silicon interface, further increasing the open circuit voltage, whilst providing a low resistance ohmic contact between the silicon and the metal.

Furthermore, the cost of a solar cell is heavily influenced by the choice of metallisation process. Conventional screen printed solar cells dominate commercial manufacture however they require large amounts of thick-film silver paste to form the front contact which alone accounts for around a third of the cost of conversion of a silicon wafer into a solar cell. Conventional screen print cells possess homogeneous emitters and large metal contact regions, resulting in high recombination at metal-silicon interfaces, low short-wavelength response, high contact resistance and high shading losses. When used with fully metallised rear surface, these cells are thus limited in voltage to around 640 mV and in efficiency to about 18%. Furthermore, screen printing exerts pressure on a solar cell, necessitating a thicker silicon substrate and hence higher cost.

The latest screen printed cells, which utilise a selective emitter, overcome some of these issues by introducing heavy doping under the screen print contacts and lighter doping elsewhere. However these cells are still limited by design compromises which restrict improvements in performance and/or manufacturing cost.

Standard interconnection of screen print solar cells using lead-containing solders is also problematic because of the need for charge carriers to flow over long distances along conductive metal fingers before being collected in a central busbar which is then connected to the next cell in the module. This necessitates a large metal coverage area leading to increased shading loss and cost, while the busbars themselves also shade around 2% of the surface of the cell. To get around this problem, interconnection schemes utilising multiple evenly spaced thin busbars have been proposed. These multiple thin busbars connect directly to the fingers on the solar cell without requiring any busbar metallisation on the cell itself and allow shortened current flow distances. This may result in lower resistive losses being achieved even with solar cell contact fingers spaced slightly further apart than previously, and may also result in lower shading losses.

However, until now module concepts using these interconnection schemes have focussed exclusively on the use of screen printed solar cells. Screen printed metallisation has limited scope to reduce metal usage or associated costs and fails to take full advantage of the benefits offered by multiple busbar interconnection schemes. This is because it is difficult with screen-printing to print metal layers much thinner than 10 microns without getting breaks in the metal lines. This is also the case with other metallisation approaches such as inkjet printing of metal inks, and even some plating techniques, where attempts to save costs by making narrower or thinner the metal lines leads to the creation of many breaks. Breaks in the metallisation generally lead to a reduction of power output for the cell.

SUMMARY

According to a first aspect, a method is provided for forming a contact structure on a solar cell having a p-n junction formed between a first semiconductor region of a first dopant polarity and a second semiconductor region of a second dopant polarity opposite to the first dopant polarity, the method comprising:

plating metal pads, comprising a low-melting temperature metal having a melting temperature less than 150° C., onto plurality of points on an exposed semiconductor surface of the solar cell to form a plurality of first contact points, whereby the first contact points provide an electrical connection to the first semiconductor region.

After plating the metal pads, a native oxide in the metal may be removed by flux such as a mixture of isopropanol and ADIPIC Acid. The metal pads may be subsequently reflowed at a temperature higher than the melting temperature (preferably 20° C. to 50° C. higher).

According to a second aspect a method is provided for forming a contact structure on a solar cell having a p-n junction formed between a first semiconductor region of a first dopant polarity and a second semiconductor region of a second dopant polarity opposite to the first dopant polarity, the method comprising:

forming a plurality of first contact points on a surface of the solar cell, whereby the first contact points provide an electrical connection to the first semiconductor region and are either an exposed silicon surface or silicon surfaces over which metal pads are formed; and locating a plurality of first conducting wires over the solar cell whereby each of the first conducting wires makes electrical connection to at least one (and preferably a plurality) of the first contact points.

According to a third aspect, a solar cell assembly comprises a solar cell having p-n junction formed between a first semiconductor region of a first dopant polarity and an second semiconductor region of a second dopant polarity opposite to the first dopant polarity, a plurality of first contact points providing electrical connection to the first semiconductor region, the first contact points being either exposed silicon surfaces or silicon surfaces over which metal pads are formed, and a plurality of first conducting wires laid across the solar cell whereby each of the first conducting wires makes electrical connection to at least one (and preferably a plurality) of the first contact points.

According to a fourth aspect, a method is provided for forming a contact structure on a solar cell having a p-n junction formed between a first semiconductor region of a first dopant polarity and a second semiconductor region of a second dopant polarity opposite to the first dopant polarity, the method comprising:

plating metal pads, comprising a low-melting temperature metal having a melting temperature of less than 150° C., over a plurality of points on the solar cell to form a plurality of first contact points, whereby the first contact points provide an electrical connection to the first semiconductor region; and locating a plurality of first conducting wires over the solar cell to make electrical connection to the first semiconductor region via at least one (and preferably a plurality) of the first contact points.

After plating the metal pads, a native oxide in the metal may be removed by flux such as a mixture of isopropanol and ADIPIC Acid. The metal pads may be subsequently reflowed at a temperature higher than the melting temperature (preferably 20° C. to 50° C. higher). The reflow step may be used to bond the metal pads to the first conducting wires contacting the metal pads.

According to a fifth aspect, a solar cell assembly comprises a solar cell having p-n junction formed between a first semiconductor region of a first dopant polarity and an second semiconductor region of a second dopant polarity opposite to the first dopant polarity, a plurality of first contact points providing electrical connection to the first semiconductor region, wherein the first contact points include metal pads, comprising a low-melting temperature metal having a melting temperature of less than 150° C., located over a plurality of points on the solar cell to provide electrical connection to the first semiconductor region, and a plurality of first conducting wires laid across the solar cell to make electrical connection to at least one (and preferably a plurality) of the first contact points.

A plurality of second contact points may also be formed on the same surface of the solar cell as the first contact points, whereby the second contact points provide an electrical connection to the second semiconductor region and are either exposed silicon surfaces or silicon surfaces over which metal pads having a thickness of less than 5 microns are formed.

The first contact points may be formed in one or more spaced parallel linear arrays and the second contact points may be formed in one or more spaced linear arrays parallel to the spaced linear arrays of first contact points, where the spaced linear arrays of second contact points are alternated with the spaced linear arrays of first contact points.

A plurality of second conducting wires may be located over the solar cell, whereby each of the second conducting wires is located to pass over the second contact points of one of the spaced linear arrays of second contact points to make electrical connection to one or more of the second contact points of the respective spaced linear array of second contact points.

The plurality of first conducting wires may be located in locations parallel to the plurality of second conducting wires, whereby each of the first conducting wires is located to pass over the first contact points of one of the spaced linear arrays of first contact points to make electrical connection to one or more of the first contact points of the respective spaced linear array of first contact points.

The solar cell may be located as one solar cell in a linear array of similar solar cells, the spaced linear arrays of first contact points of the one solar cell each aligned with respective spaced linear arrays of second contact points of solar cells adjacent to the one solar cell and the first and/or second conducting wires of the one solar cell extending across the array of solar cells whereby the first wires of the one solar cell comprise the second conducting wires of the adjacent solar cells and the second wires of the one solar cell comprise the first conducting wires of the adjacent solar cells.

According to a sixth aspect a method of interconnecting an array of solar cells is provided comprising:

forming a contact structure on each solar cell in the array, each solar cell having a p-n junction formed between a first semiconductor region of a first dopant polarity and a second semiconductor region of a second dopant polarity opposite to the first dopant polarity, including i) forming a plurality of first contact points in one or more spaced parallel linear arrays on a surface of each solar cell, whereby the contact points provide an electrical connection to the first semiconductor region and are either exposed silicon surfaces or silicon surfaces over which metal pads are formed having a thickness of less than 5 microns;

ii) forming a plurality of second contact points in one or more spaced linear arrays parallel to the spaced linear arrays of first contact points on the same surface of each solar cell as the first contact points, whereby the second contact points provide an electrical connection to the second semiconductor region and are either exposed silicon surfaces or silicon surfaces over which metal pads having a thickness of less than 5 microns are formed, locating the solar cells in a linear array of solar cells, the spaced linear arrays of first contact points of one solar cell of the array each aligned with respective spaced linear arrays of second contact points of solar cells adjacent to the one solar cell;

locating a plurality of first conducting wires to extend over the array of solar cells, whereby each of the first conducting wires is located to pass over the first contact points of one of the spaced linear arrays of first contact points of the one solar cell to make electrical connection to at least one of the first contact points of the one solar cell and every alternate solar cell in the array relative to the one solar cell;

locating a plurality of second conducting wires to extend over the array of solar cells, whereby each of the second conducting wires is located to pass over the second contact points of one of the spaced linear arrays of second contact points of the one solar cell to make electrical connection to one or more of the second contact points of the respective spaced linear array of second contact points of the one solar cell and every alternate solar cell in the array relative to the one solar cell; and the first conducting wires of the one solar cell comprise the second conducting wires of the solar cells adjacent to the one solar cell and every alternate solar cell in the array relative to the adjacent solar cells and the second wires of the one solar cell comprise the first conducting wires of the adjacent solar cells and every alternate solar cell in the array relative to the adjacent solar cells.

According to a seventh aspect an interconnected linear array of solar cells comprises:

a contact structure located on each solar cell in the array, each solar cell having a p-n junction formed between a first semiconductor region of a first dopant polarity and a second semiconductor region of a second dopant polarity opposite to the first dopant polarity, including i) a plurality of first contact points located in one or more spaced parallel linear arrays on a surface of each solar cell, wherein the contact points make electrical connection to the first semiconductor region and are either exposed silicon surfaces or silicon surfaces over which metal pads are located having a thickness of less than 5 microns;

ii) a plurality of second contact points in one or more spaced linear arrays parallel to the spaced linear arrays of first contact points on the same surface of each solar cell as the first contact points, wherein the second contact points make electrical connection to the second semiconductor region and are either exposed silicon surfaces or silicon surfaces over which metal pads are located having a thickness of less than 5 microns, the linear array of solar cells being arranged with the spaced linear arrays of first contact points of one solar cell of the array each aligned with respective spaced linear arrays of second contact points of solar cells adjacent to the one solar cell;

a plurality of first conducting wires positioned over the array of solar cells, wherein each of the first conducting wires passes over the first contact points of one of the spaced linear arrays of first contact points of the one solar cell to make electrical connection to at least one of the first contact points of the one solar cell and every alternate solar cell in the array relative to the one solar cell;

a plurality of second conducting wires positioned over the array of solar cells, wherein each of the second conducting wires passes over the second contact points of one of the spaced linear arrays of second contact points of the one solar cell to make electrical connection to one or more of the second contact points of the respective spaced linear array of second contact points of the one solar cell and every alternate solar cell in the array relative to the one solar cell; and the first conducting wires of the one solar cell comprise the second conducting wires of the solar cells adjacent to the one solar cell and every alternate solar cell in the array relative to the adjacent solar cells and the second wires of the one solar cell comprise the first conducting wires of the adjacent solar cells and every alternate solar cell in the array relative to the adjacent solar cells.

When the first and/or second contact points comprise metal pads, the metal pads may have a thickness of less than 5 microns. Alternatively the metal pads may have a thickness of less than 2, 1 or 0.5 microns. If present the metal pads are preferably greater than 0.1 micron thick.

The plurality of first and/or second contact points may be formed by forming a plurality of heavily doped regions extending from the surface of the solar cell into the first semiconductor region, the heavily doped regions being more heavily doped with dopant of the first dopant polarity than the first semiconductor region. The heavily doped regions may be formed with a sheet resistance of 1 to 50 ohms/square and preferably 20 ohms/square.

The first and/or second contact points may also comprise metal pads formed directly onto an exposed surface of the first semiconductor region at points where connection between the wires and the first semiconductor region are to be made.

The first and/or second contact points may comprise regions which are circular, oval, square, rectangular or polygonal in shape and may have dimensions in the plane of the surface of the solar cell in the range of 8-12 microns. The first and/or second contact points may also comprise elongate parallel regions having a width in the range of 8-12 (notionally 10) micron. The first and/or second conducting wires are preferably located such that a conducting wire passes over each of the first and/or second contact points.

Where heavily doped regions are used the heavily doped regions may comprise elongate parallel channels and the elongate parallel channels may be 8-12 (notionally 10) micron wide in the plane of the surface of the solar cell. The first and/or second conducting wires are preferably located to cross the elongate parallel channels and are preferably located to cross the elongate parallel channels generally perpendicularly. A dielectric layer may be formed over the first semiconductor region with openings formed in the dielectric layer to expose areas where the heavily doped regions are to be formed, and the first and/or second conducting wires may be placed over the dielectric layer to form a connection to the heavily doped regions through the openings in the dielectric layer. Metal pads may be formed over the heavily doped regions to electrically connect to the heavily doped regions but will be isolated from the remainder of the first semiconductor region by the dielectric layer and the wires may be positioned over the surface of the solar cell to make contact with the heavily doped regions via the metal pads. The metal may be applied onto the heavily doped regions by plating.

The heavily doped regions may be formed by providing a dopant source on or near the surface of the solar cell and laser heating the dopant source and the first semiconductor region in a pattern corresponding to the locations of the heavily doped regions to cause dopants from the dopant source to dope the heavily doped regions to the required concentration, while simultaneously disrupting the dielectric layer forming openings in the dielectric layer to expose surfaces of the resultant heavily doped regions. A dielectric layer may be formed over the first semiconductor region with openings formed in the dielectric layer to expose a surface of the first semiconductor region, and the first and/or second conducting wires may be located over the dielectric layer and connected to the first semiconductor region through the openings in the dielectric layer. Metal pads may be formed over and electrically connected to surfaces of the first semiconductor region such that they are isolated from the remainder of the first semiconductor region by the dielectric layer and the wires located over the surface of the solar cell may make contact with the surfaces of the first semiconductor region via the metal pads. The metal may be applied by plating onto the surfaces of the first semiconductor regions. The metal pads may be formed by plating and may comprise a layer or layers of nickel, silver, tin and/or a metal with a melting point below 150° C. Alternatively the metal pads may be a plated layer or layers of nickel, silver and/or tin over which a final layer of a metal with a melting point below 150° C. is plated. The metal with a melting point below 150° C. may be selected as an alloy of tin with indium and/or bismuth and may be a eutectic composition of tin with indium and/or bismuth.

The first semiconductor region is preferably formed with a sheet resistance of 80 to 200 ohms/square.

The method may further include bonding an encapsulant layer over a surface of the solar cell and the wires.

Preferably each of the first and/or second contact points is contacted by one of the first and/or second conducting wires. The wires may be placed on the surface of the solar cell before encapsulating the solar cell or the wires may be attached to a sheet of encapsulant and applied to the surface of the solar cell together with the encapsulant. When the wires are attached to the encapsulant, they may be fabricated onto the sheet of encapsulant such as by printing a metal seed layer onto the sheet of encapsulant and plating metal onto the metal seed layer to create a wire of the required cross-sectional area. The metal seed layer may be nickel, silver or poly (3,4-ethylenedioxythiophene):poly(4-styrenesulfonate) and the plated metal may be copper or silver.

The first and/or second conducting wires may also be coated with a low-melting temperature metal such as an alloy of tin with indium and/or bismuth.

Preferred embodiments of the invention provide a new photovoltaic cell construction in which no busbars are integrally formed on the surface of the solar cell prior to encapsulation. Interconnection of the first and/or second contact points on the surfaces of the solar cell is achieved using perpendicular multiple busbar wires laid over the cell and bonded to the respective first and/or second contacts on the surfaces of the solar cell during the encapsulation process. Transport of current along the surface of the cell to the metal wires may be via heavily doped, narrow (around 10 micron) conductive channels, formed by selectively doping the silicon in the channels to a higher dopant concentration than the remainder of the surface region of the solar cell. The heavily doped channels may also have a thin capping of metal to assist in connecting to them. Alternatively the heavily doped channels may be omitted and a metal track may be placed directly onto the first semiconductor region. Collection of current and interconnection of one cell to the next in a module string is accomplished by a perpendicular array of first and/or second conductive metal busbar wires which make electrical contact to the conductive channels. If necessary, contact resistance between the first and/or second perpendicular metal wires and the solar cell conductive semiconductor channels can be reduced by plating a thin (less than 2 micron) layer of nickel, silver or tin over the semiconductor channels. Alternatively, the conductive channels on the solar cell can be formed by opening a dielectric layer by laser or other method, followed by plating a thin (less than 2 micron) layer of nickel, silver or tin over the opened regions. No other metallisation is necessary.

Semiconductor finger or channel technologies have previously required screen print metallisation. However conductive channels formed on the cell surface by heavy doping of silicon, in conjunction with a perpendicular array of first and/or second conductive metal wires laid over the semiconductor channels to collect the current from the conductive channels, provides a selective emitter by ensuring first and/or second metal contact points are only made to heavily doped regions, reduces contact resistance because metal contact points are only made to heavily doped regions, and eliminates all high temperature/high pressure processing steps by eliminating the need for screen print metallisation. The ability to plate a thin layer of either metal or metal alloy to the semiconductor channels can reduce contact resistance and improve adhesion of the metal wires to the semiconductor channels.

The use of various forms of this contact methodology potentially allows the following advantages over conventional solar cells:

1. Process steps and cost associated with front surface screen printed metallisation is avoided.
2. Expensive high temperature processing steps are avoided.
3. The cost of expensive metals such as silver and copper is either eliminated or drastically reduced.
4. The process complication associated with interconnection of high efficiency selective emitter cell technology is avoided.
5. Toxic lead based solders are avoided, as are the high temperatures needed for solder based interconnection along with associated yield loss.
6. Toxic lead based cell metallisation is avoided.
7. High efficiency is achieved via higher device currents and higher fill factor and higher voltage. High current is enabled through use of a selective emitter with good short wavelength response and low shading loss resulting from the lack of cell busbars and narrow channel width. High voltage is achieved via lightly doped emitter regions in close proximity to the light receiving surface and heavily doped regions at any silicon/metal interfaces, while high fill factor is achieved through reduced length of conductors on the solar cell and narrow conductors allowing fine spacing.
8. Excellent plated channel adhesion (if plating is used) due to very thin (less than 2 micron) metal layers.
9. If plating is used, there is no need for nickel sintering, formation of silicide barrier layers or protective capping layers, because there is no use of copper which can diffuse into the solar cell causing defects or into the module materials causing degradation.
10. Any cell metallisation and interconnection is self-aligning.

One example of a suitable interconnection technology involves applying an electrically insulating optically transparent film over the surface of the solar cell, the film having an adhesive applied to its surface to bond it to the solar cell and a plurality of parallel first and/or second conductive wires embedded in the adhesive to contact the solar cell and act as busbars. The electrically insulating optically transparent film should have high optical transmittance, high electrical insulation, high thermal conductivity, high stability to ultra-violet exposure and good refractive index matching.

As an alternative, the metal busbar wires can be formed on a polymer sheet of, for example, EVA, by first printing a seed layer according to the required pattern of metal wires and then plating these seed layers with a conductive metal (e.g., copper) and then coating the wires by plating a surface layer of a low-melting temperature alloy. The low-melting temperature alloy may be reflowed at a temperature higher than the melting temperature (preferably 20° C. to 50° C. higher) to provide a mechanical adhesion to the plated semi-conductor channels on the surface of the solar cell and to improve electrical connection. Alternatively, the array of perpendicular first and/or second conductive metal wires could be tin plated, with the solar cell conductive channels plated with the low-melting temperature alloy, or both the solar cell conductive channels and the array of perpendicular first and/or second conductive metal wires could be plated with the low-melting temperature alloy. A native oxide which forms on the low-melting temperature alloy may be removed by flux to improve the wettability and facilitate the reflow process. The flux may be a mixture of isopropanol and ADIPIC Acid.

The reflow of the low-melting temperature alloy will also serve to mix the alloy metals if the plating step does not deposit the metals uniformly. This would also permit the metals to be deposited sequentially and subsequently mixed.

Examples of metal alloys that have sufficiently low melting temperatures include alloys of tin with elements such as indium or bismuth. The melting temperature of the alloy can be minimised by selecting a metal composition ratio corresponding to the eutectic composition (i.e., the alloy that will have the lowest melting temperature).

BRIEF DESCRIPTION OF THE DRAWINGS

Embodiments of the invention will now be described, by way of example, with reference to the accompanying drawings in which.

DETAILED DESCRIPTION

Referring to FIGS. 1 to 4, a novel solar cell top surface design is illustrated in which dependence of homogeneously heavily diffused emitters is removed, thereby improving performance in response to short wavelengths of light when compared with previously available commercial solar cells.

Figure 1:
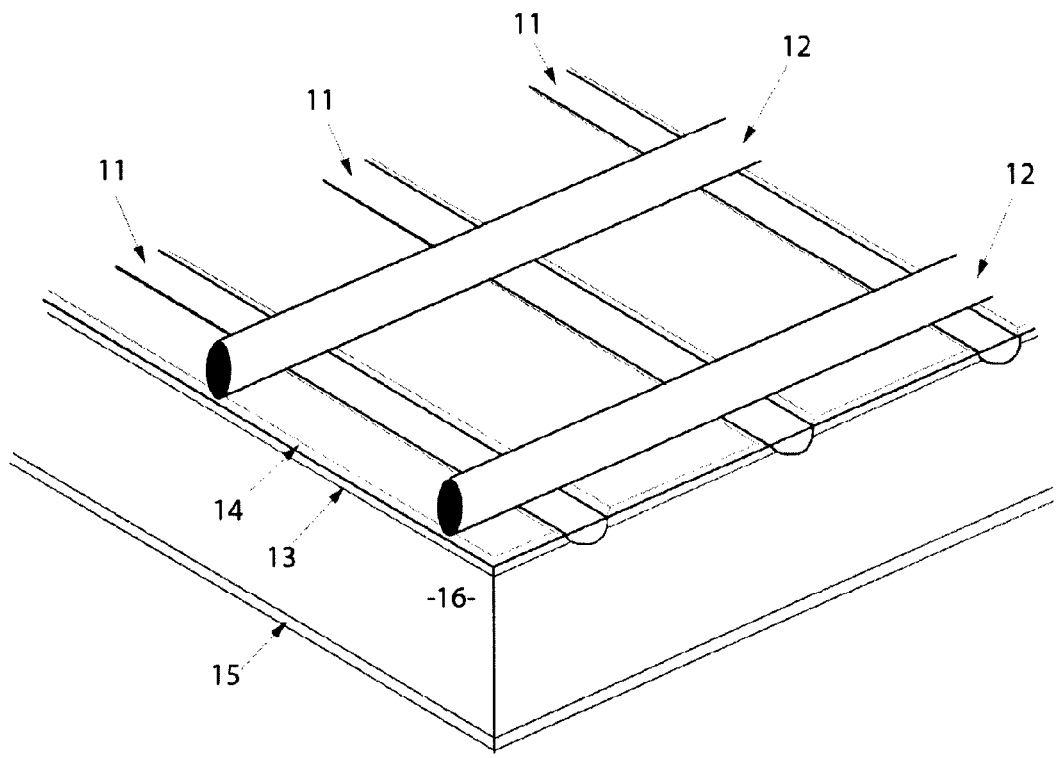
FIG. 1 diagrammatically illustrates a solar cell structure with an emitter contact according to an embodiment of the invention.

The proposed structure is depicted in FIG. 1 which shows a solar cell comprising a p-type silicon substrate 16 in which a lightly doped n-type emitter is formed on the textured front surface, preferably by thermal diffusion. The emitter is doped to a sheet resistance of 80 and 200 ohms/square. The invention can also be applied to a cell formed on an n-type substrate with a p-type emitter in which case all of the polarities in the following description will be reversed.

The silicon surface is well passivated by a silicon nitride layer or similar dielectric layer 14 which also acts as an antireflection coating.

Parallel laser doped conductive channels 11 are formed in the front surface extending through the emitter 13 and dielectric layer 14 and are spaced apart by distances in a range of 0.5 to 5 mm, but say nominally 1 mm. Multiple busbar wires 12 are laid over and run perpendicular to the channels 11 to interconnect the channels 11 and provide electrical connection points to the front (i.e. the emitter 13) of the solar cell. The dopant source for the laser doping may be a solution containing phosphorus applied to the cell surface, a solid layer of phospho-silicate glass (PSG) formed during the light emitter diffusion, or the lightly doped emitter layer 13 itself. In the latter case, the formation of conductive channels is achieved by melting the emitter layer 13 where the channels are to be formed to redistribute phosphorus atoms in the molten region.

The use of the perpendicular busbar wires 12 provides tolerance and immunity to breaks in the metal lines, avoiding the usual power losses and facilitating the use of much thinner metal layers (or possibly the total absence of metal) at lower cost with less concern over breaks in metal lines.

A rear connection may be formed by applying a metal layer 15 to the rear of the p-type substrate 16 to allow electrical connection to the substrate. This may be applied by screen printing a metal paste on to the rear surface and sintering the paste.

Figure 2:
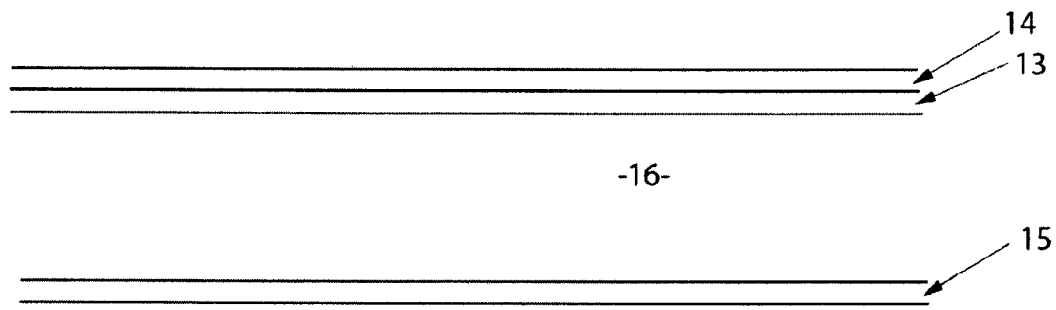
FIG. 2 diagrammatically illustrates a step in the formation of the structure of FIG. 1.

FIG. 2 is a schematic cross section illustrating the first stages in the fabrication of the proposed emitter 13. The lightly doped phosphorus emitter layer 13 is formed by thermal diffusion of phosphorus into the top surface of a p-type crystalline silicon wafer 16. This emitter region can be formed with a sheet resistance of 80 ohms/square or greater and preferably has sheet resistance of about 200 ohms/square. The wafer is then passivated using silicon nitride deposition 14 or other commercial passivation techniques. A phosphorus containing dopant source is sprayed or spun onto the surface of the wafer, or alternatively the emitter layer itself can be used as a dopant source or the PSG formed during the emitter formation may be retained and used as a dopant source. One advantageous structure makes use of lines of heavily doped n-type silicon 11 forming conductors within the silicon (as seen in cross-section in FIG. 4) and extending across the surface emitter region 13. These heavily doped conductors provide high conductivity paths from the lightly doped emitter layer 13 to the metal busbar wires 12 connected to the solar cell.

Figure 3:
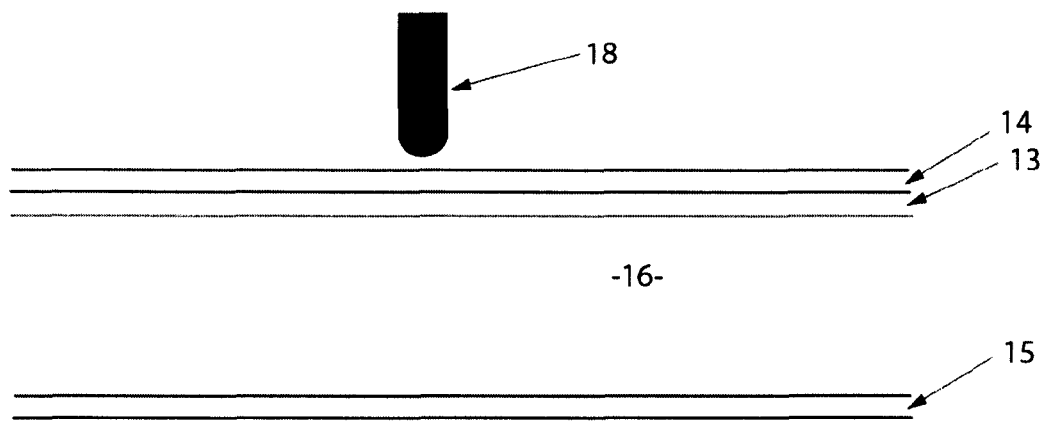
FIG. 3 diagrammatically illustrates a further step in the formation of the structure of FIG. 1.
Figure 4:
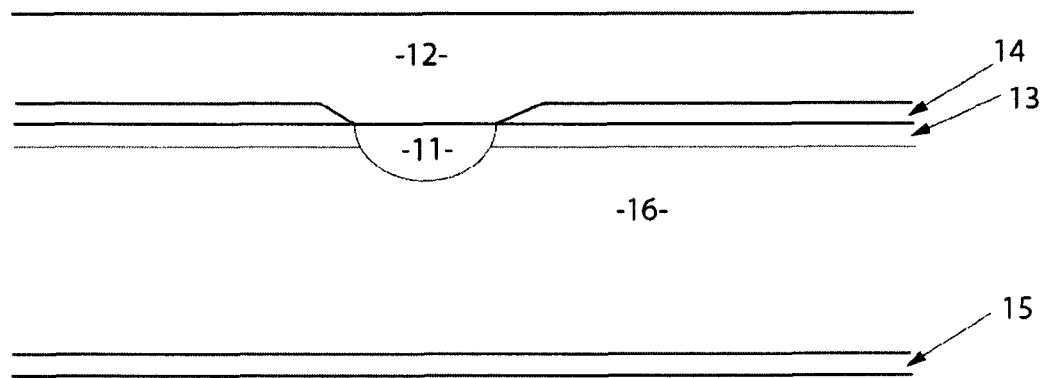
FIG. 4 diagrammatically illustrates a yet a further step in the formation of the structure of FIG. 1.

One possible doping technique for forming the heavily doped conductors 11 involves using a laser 18 (as seen in FIG. 3), whereby lines of silicon (and the overlying passivation layer) are melted and recrystallised to produce the heavily doped n-type conductors 11 (as seen in cross-section in FIG. 4).

However other thermal diffusion methods might also be used, such as:
1) Masking the surface and applying a dopant source only where the mask is open (or using a mask that will block diffusion in unopened areas), followed by thermal processing in an oven or under heaters;
2) Using a surface dielectric layer as a mask and etching the pattern for the heavily doped channels 11 in the dielectric layer using an inkjet deposited etchant and doping as in 1) above;
3) Masking as per 1) or 2) above and thermally processing using a non-laser localised heat source.

The cell structure of FIG. 4 addresses fundamental limitations of screen printed metal contacts with their inability to form fine lines and make ohmic contact to lightly doped emitters. It also presents an alternative structure to conventional plated solar cells, which can be difficult to interconnect and may require the use of copper which is highly diffusive even at low temperatures and detrimental to cell and module performance if it is not contained by barrier or capping layers.

Figure 5:
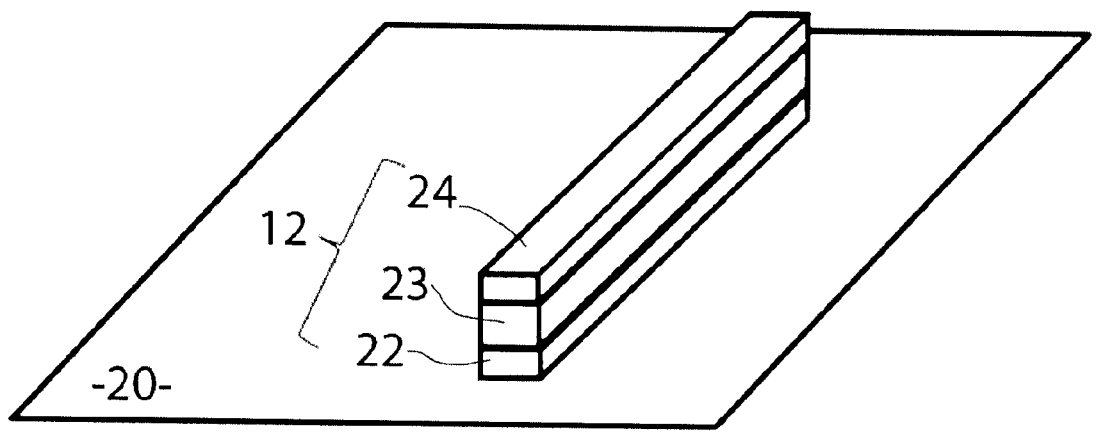
FIG. 5 diagrammatically illustrates a method of fabricating wires on a transparent sheet.

In one design, the multiple busbars of conductive metal wire 12 run perpendicularly to heavily doped channels 11. Each conductive metal wire 12 may be a freestanding conventional drawn wire or it may be supported and fabricated on a polymer sheet 20 shown in FIG. 5. The conductive metal wire 12 may consist of single layer of metal or multiple layers, for example three layers 22, 23, 24 are shown in FIG. 5. In the FIG. 5 example the wires are plated onto the sheet, by first forming a bottom layer 22, in contact with the polymer sheet 20, which may serve as the conductive metal seed layer, and provides reliable adhesion to the polymer sheet 20. For plating, the bottom layer 22 needs to be conductive, such that the middle layer 23 can be grown onto it by one of various plating processes. The middle layer 23 is coated with a thin coating layer 24 consisting of metal alloy with low melting temperature.

Figure 6:
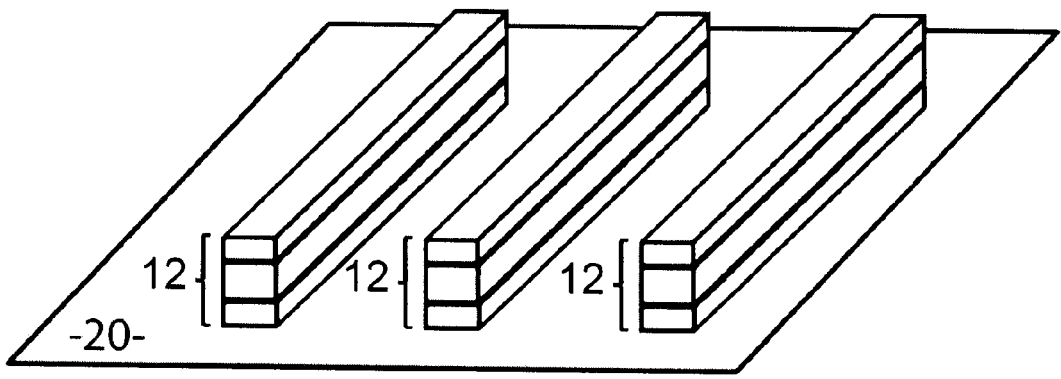
FIG. 6 diagrammatically illustrates a plurality of parallel fabricated wires on a transparent sheet.

FIG. 6 shows an array of conductive metal wires 12 on a polymer sheet 20. The polymer sheet 20 may be additional to the encapsulant in which case it must have high optical transmittance, and preferably also has high electrical insulation, high thermal conductivity, high stability to ultraviolet exposure and good refractive index matching. Materials similar to traditional encapsulants would be suitable if an additional sheet is used. For example, Ethylene Vinyl Acetate (EVA) is a preferable material that has been dominantly used as an encapsulant in photovoltaic industry. Other suitable materials are polyvinyl butyral (PVB) and thermoplastic polyurethane. However the use of the encapsulant layer itself to support the conductive metal wires is preferred as it makes the use of intermediary polymer sheets unnecessary.

The pattern of the array of wires 12 is determined during the formation of the conductive metal seed layer 22. A wide range of materials can be used as the conductive metal seed layer 22: silver nanoparticles, nickel nanoparticles, and conductive polymers such as poly (3,4-ethylenedioxythiophene):poly(4-styrenesulfonate). Possible pattering approaches include inkjet printing and aerosol jet printing, both being reliable and high-throughput techniques. After patterning of the conductive metal seed layer 22, sintering may be required to achieve sufficient conductivity. The middle layer 23 provides the conductivity necessary to transport electrons from one solar cell to the next in the module. The distance between adjacent conductive metal wires 12 and the thickness of the middle layer 23 should preferably be designed to conduct the current with desired low resistive loss. Electroplating is one of the preferred processes to form the middle layer 23, with thickness being controlled by plating current and plating time. Examples of suitable materials for the middle layer 23 are copper, nickel, tin, silver, gold, etc.

The coating layer 24 should have low melting temperature. Preferably, the coating layer 24 melts at a temperature of less than 200° C. and more preferably at a temperature below 150° C. Examples of metal or metal alloy that have sufficient low melting temperatures include alloys of tin with elements such as indium or bismuth. The melting temperature of the alloy can be minimized by selecting a metal composition ratio corresponding to the eutectic composition, at which the alloy has the lowest melting temperature. The coating layer 24 is shown in FIGS. 5 & 6 as coating only one surface of the of the middle layer 23, however it will be appreciated that the coating layer could coat all of the exposed surface of the wire 12.

The deposition of the coating layer 24 on the middle layer 23 can be achieved by electroplating. For tin-bismuth alloy, the composition of the plating electrolyte needs to be designed because the onset deposition potentials of the two metals are different. In order to have tin and bismuth plating simultaneously, complex agents are necessary to be added to the electrolyte such that stable complex species are formed between the metals and the complex agents, reducing the gaps between the two onset deposition potentials. Table 1 shows an example of the composition of the electrolyte. The pH value of the electrolyte is adjusted by hydrochloric acid and ammonium hydroxide to maintain the electrolyte clear without precipitates. The metal composition ratio varies with the plating current density. By controlling the current density, the eutectic composition can be deposited. Preferably electroplating is performed at 25° C. with a current density of 20 mA/cm$^2$, or at other plating temperatures with a suitable current density. The thickness of the coating layer 24 has to be thick enough to reduce the contact resistance and provide sufficient adhesion force between the conductive metal wire 12 and the conductive semiconductor channel 11.

TABLE 1

| Plating electrolyte composition | |
| --- | --- |
| Chemicals | Concentration |
| $Bi(NO_3)_3 \cdot 5H_2O$ | 0.05M |
| $SnCl_2 \cdot 2H_2O$ | 0.15M |
| Citric Acid | 0.30M |
| EDTA | 0.05M |
| PEG400 | 0.20M |

During the typical process of photovoltaic module lamination, pressure is applied and temperature is increased to 150° C. Since either the wire 12 or the semiconductor channel 11 (see description of FIG. 7 below) or both is coated with a low-melting temperature alloy preferably having a melting temperature below 150° C., the metal alloy melts and thus enables electrical contact between the conductive metal wire busbars 12 and the semiconductor channels 11 on the surface of the solar cell at each interconnection of the two.

Figure 7:
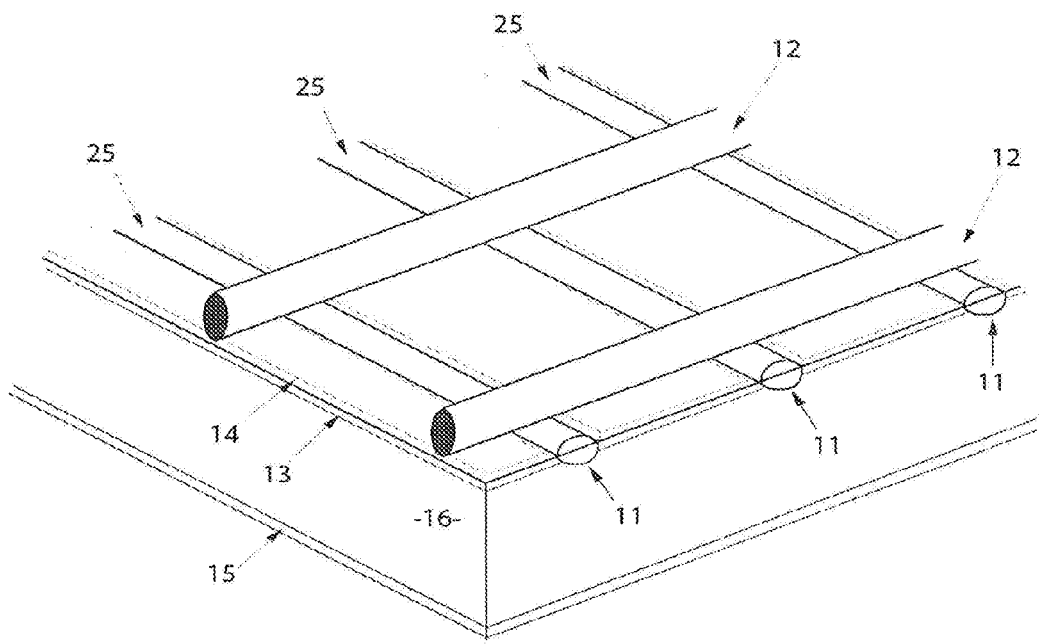
FIG. 7 diagrammatically illustrates an alternative embodiment of an emitter contact to the arrangement of FIG. 1.

In order to make reliable electrical contact and adhesion between the conductive metal wire busbars 12 and the semiconductor channels 11 on the surface of the solar cell, it may be desirable to plate an intermediate layer of metal 25 over the semiconductor channels 11, as shown in FIG. 7. Since the formation of the semiconductor channels 11 results in openings in the dielectric passivation layer 14 directly above the semiconductor channel, plating onto the heavily doped n-type channels will be a self-aligning process. This intermediate layer 25 may comprise, for example, nickel, silver, tin or a low-melting temperature alloy, or layered combinations of these metals, preferably with a final layer of low-melting temperature alloy. Examples of metal or metal alloy that have sufficient low melting temperatures include alloys of tin with elements such as indium or bismuth. The melting temperature of the alloy can be minimized by selecting a metal composition ratio corresponding to the eutectic composition, at which the alloy has the lowest melting temperature.

In the example of FIG. 7 which is a solar cell with an n-type emitter, an electroplating method such as light induced plating (LIP) may be performed to plate the intermediate layer 25. To obtain the eutectic composition of tin-bismuth alloy, electroplating is preferably performed at 25° C. with a current density of 20 mA/cm², or preferably LIP is performed at a current density correspondingly to the solar cell's operating temperature which depends on the illumination intensity. In the case of p-type emitters (105 in FIG. 9), field induced plating (FIP) may be used as described later.

Figure 8:
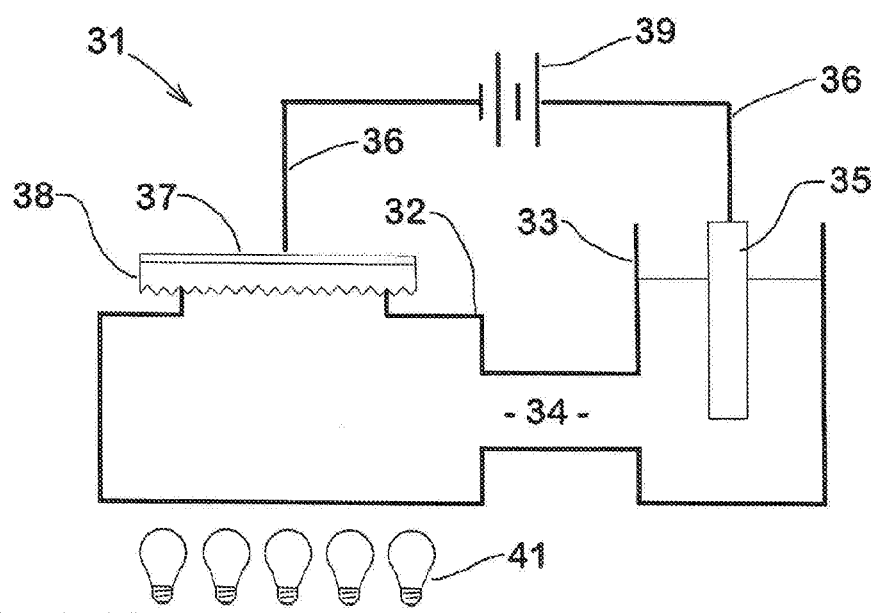
FIG. 8 diagrammatically illustrates a plating arrangement for Light Induced Plating (LIP) of emitter contacts for a solar cell device with a p-type wafer and front n-type emitter.

A suitable plating apparatus 31 for LIP of the metallisation 25 for the n-type emitter of FIG. 7 is schematically illustrated in FIG. 8 and includes a bath chamber 32 connected to an anode chamber 33 and together containing the plating solution 34, in which an anode 35 is located. A circuit 36 connects the anode to the rear aluminium electrode 37 of a Laser-Doped Selective Emitter (LDSE) solar cell 38 via a power supply 39. The plating solution 34 is as per Table 1 and as the plating solution is highly acidic, the HCl in the plating solution would corrode the rear aluminium electrodes 37 of the LDSE cell 38 if the cell were fully immersed in the plating solution. Consequently, the rear aluminium electrode 37 of the cell is kept dry while plating the front contact metal 25 (see FIG. 7). The Sn—Bi plating solution 34 is held in a transparent container, which allows a light source 41 to illuminate the front surface of the LDSE cell 38 from the bottom of the bath. The power supply 39 is operated in a constant current mode to control the bias current to achieve a eutectic Sn—Bi composition.

Figure 9:
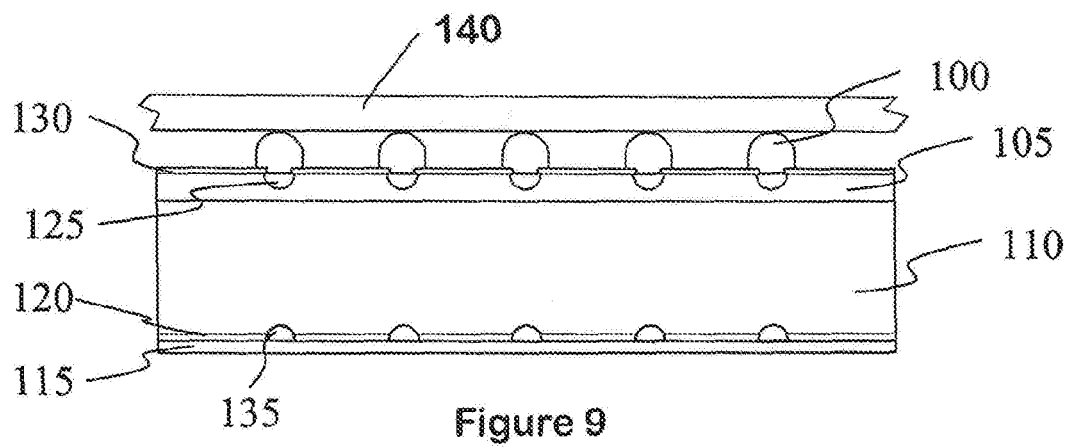
FIG. 9 diagrammatically illustrates a plating arrangement for Field Induced Plating (FIP) of emitter contacts for a solar cell device with an n-type wafer and front p-type emitter.

FIG. 9 shows a solar cell with a p-type emitter 105 with heavily doped p-type contact regions 125 and p-type contact metallisation 100. As mentioned above, field induced plating (FIP) may be used to plate metal such as the metallisation 100 in FIG. 9 onto the contact regions 125 of a p-type emitter of a solar cell such as a LDSE cell formed on an n-type substrate. Alternatively this method may be used to plate directly to the lightly doped emitter through openings in the overlying dielectric layer 130 without forming the heavily doped regions 125. As with the examples described above, a plurality of wires 140 contact the metallisation 100.

Figure 10:
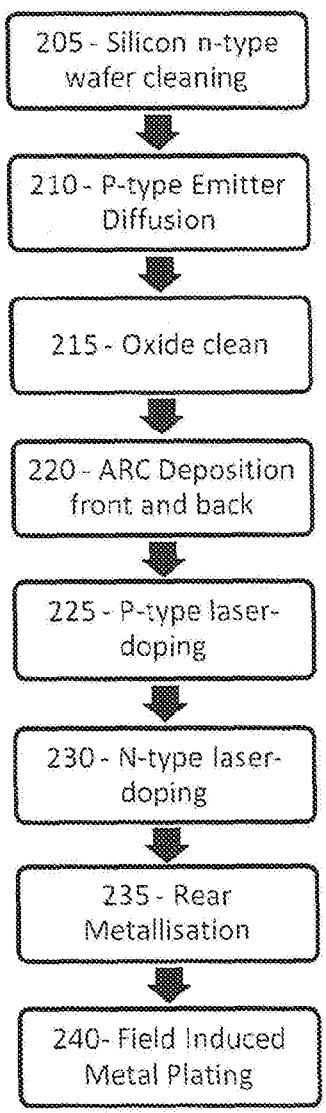
FIG. 10 is a process flow for the fabrication of the device depicted in FIG. 9.

FIG. 10 depicts the process steps required to fabricate the solar cell of FIG. 9. This structure requires the use of an n-type silicon wafer 110. The process begins with the cleaning of the silicon substrate in step 205. This removes any wire sawing damage on the surface of the wafer and removes any metal impurities from the surface. Preferably this step also includes the texturing of the surface to reduce the amount of light that is reflected from the illuminated surface.

Mono-crystalline wafers are typically textured using an alkaline texturing process using aqueous solutions of potassium or sodium hydroxide [3-5% (w/v)] and isopropanol [3-5% (v/v)] that creates randomly-located small pyramids over the surface. An acidic etching solution is more typically used to texture multi-crystalline wafers. Acidic texturing is performed in solutions containing hydrofluoric acid and nitric acid, with the nitric acid being responsible for oxidising the silicon surface and the hydrofluoric acid dissolving the formed oxide. Typically acidic texturing solutions comprise ~45% (w/v) nitric acid and ~15% (w/v) hydrofluoric acid and texturing is performed without a previous saw-damage etch step because the texturing process requires the presence of the saw damage defects for the texturing effect.

In the next step 210, a p-type emitter 105 is formed on the front surface by furnace diffusion of boron to form the p-n junction of the solar cell. During the thermal diffusion process, a boron silicate glass (oxide) forms at the surface of the wafer. The oxide is then removed by a second cleaning step 215. This is preferably performed in a solution of hydrofluoric acid. This cleaning step also prepares both the front and rear surfaces of the cell for the deposition of passivating dielectric layers. Preferably a silicon nitride layer of ~75 nm thickness is deposited over both front and rear wafer surfaces using PECVD in step 220 to form front surface 130 and rear surface 120 dielectric layers. The front surface silicon nitride layer 130 acts as an ARC and helps passivate the front surface of the solar cell and reduce the overall reflection of the surface. Furthermore, it also forms an insulating barrier during the formation of the metal contacts in the FIP step described later. A layer of aluminium oxide, or some combination of aluminium oxide and silicon nitride, can also be used to passivate the p-type surfaces.

A silicon nitride layer formed over the rear surface 120 provides a passivating layer. An advantageous property of silicon nitride layers deposited by PECVD is that they contain stored positive charges which attract electrons in the n-type silicon to the silicon-silicon nitride interface. This results in the formation of an accumulation layer which reduces the surface recombination velocity of the interface. The formed accumulation layer can be viewed as acting like a weak back surface field (BSF) which serves to repel minority carrier holes from the rear surface. Alternative processing sequences can directly form a BSF by diffusing an n-type layer over the entire rear surface.

In step 225 p-type laser-doped regions 125 are formed on the surface of the p-type emitter 105 preferably after spin-coating a layer of a boron doping source, such as provided by companies such as Filmtronics. Alternatively, if aluminium oxide has been used as the front passivating dielectric it can provide a source of aluminium atoms for the p+ laser-doping. Preferably the sheet resistance at the base of the p-type laser-doped regions is at most 50 Ohm/sq. Alternatively the laser doped regions 125 may be omitted and the plating step described below may be performed directly onto the lightly doped p-type emitter 105 through openings made in the silicon nitride layer 130 (by laser or chemical etching).

N-type laser-doped contact regions 135 are then formed at the rear surface of the cell in step 230, substantially using the process described above for the p-type emitter contacts of the LDSE cells. Point contacts have the advantage of reducing the metal silicon area and thus reducing the saturation current density and increasing the implied open circuit voltage of the final device, however formation of point laser-doped regions typically requires the use of a Q-switched laser or else a mask which is used in conjunction with a continuous wave laser with the latter having issues associated with aligning the mask with the solar cell. Preferably the sheet resistance at the base of the n-type laser-doped regions is at most 20 Ohm/square and more preferable ≤10 Ohm/sq. The spacing of the rear fingers or the point contacts is such that no more than 10% of the surface area is heavily doped and preferably in the vicinity of 1%. Furthermore, deeper laser-doped regions are desirable in order to achieve a more effective local BSF to repel minority carriers from the high surface recombination velocity metal-silicon surface. Although laser-doping is the preferred way of forming the heavily-doped regions in the cell, other methods of forming openings (e.g., patterned etching) can also be used.

Metal contact is then made to the n-type (rear surface) laser-doped regions in step 235 by sputtering aluminium over the entire rear surface. Preferably the aluminium layer 115 is at least 2 um thick. Alternatively, the rear electrode can be formed by either thermal or e-beam evaporation of aluminium, or screen-printing of aluminium paste. In the variation where screen-printed paste is used a short heat curing process is required to drive out solvents used in the pastes. In this case, if the wafer is heated above 577° C. (the eutectic temperature for aluminium and silicon), the n-type silicon has to be sufficiently heavily doped so that the firing of the aluminium does not lead to the formation of a localised p+ region underneath the aluminium that forms a rectifying junction with the n-type silicon. The rear aluminium layer contacts the silicon in the laser-doped openings to form local contacts. Having the full surface covered with aluminium provides a rear reflector for the cell, an important attribute especially as wafers become thinner and a larger proportion of the longer wavelength light can pass through the cell without absorption. Small amounts of silicon (e.g., <1%) can be added to the aluminium used to form the rear metal layer to minimise the risk of device degradation due to silicon diffusion into the aluminium. Alternatively, stacks of deposited metal can be employed in this rear metal electrode, with barrier layers comprising metals such as nickel, titanium, or tungsten, being used to limit interdiffusion of silicon and aluminium.

In a variation to the abovementioned method of forming rear contacts through the rear silicon nitride layer 120, before the plating process silver paste fingers can be screen-printed and then fired through the silicon nitride layer 120 substantially as described for prior art screen-printed silicon solar cells. Preferably the firing temperature is maintained below 700° C. to avoid damage to the hydrogen passivation provided by the silicon nitride layer. The screen-printed metal grid can then act as the rear metal electrode (i.e., equivalent of 115 in FIG. 9). In this variation, the rear surface of the cell is preferably encapsulated with a reflective backsheet to maximise light trapping in the cell. Alternatively it can be integrated into a bifacial module where light can be captured from both surfaces.

Figure 11:
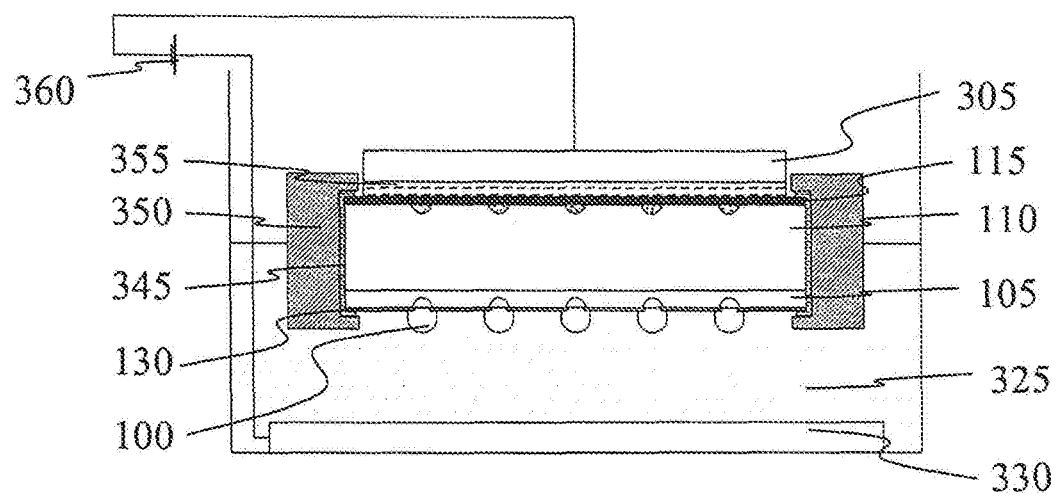
FIG. 11 is a diagrammatic illustration of a field inducted plating (FIP) apparatus.

The wafer is now prepared for the FIP process which is performed in step 240. The wafer is placed into an apparatus that is used to perform FIP as shown in FIG. 11. The FIP process results in the formation of plated metal contacts 100 on the p+ laser-doped regions 125 formed in the p-type emitter 105. The apparatus is such that the front surface p-type emitter 105 and the rear aluminium electrode 115 of the solar cell depicted in FIG. 9 are electrically isolated. This can be achieved using a water impermeable material 345 such as nitrile foam allowing for only the front of the surface to be submerged in a plating solution 325 whilst the rear surface 115 remains dry. In addition the impermeable material 345 must avoid non uniform pressures on the wafer to avoid breakage. The impermeable material 345 is preferably in contact with a wafer holder 350 that can move the wafer through a plating bath, with the speed of the wafer holder 350 determining the effective plating time.

The rear metal contact on the solar cell 115 is placed to come in physical contact with a conductive electrode 305. A conductive interface material 355 is placed between the rear electrode of the cell 115 and the conductive electrode 305. This interface material 355 is preferably an expanded graphite material to provide the necessary conductivity without damaging the surface of the wafer. The conductive interface material 355 and the electrode 305 are preferably enclosed within the wafer holder 350. Furthermore the interface material 355 can consist of a stack of other foam materials to control the amount of direct pressure applied to the surface of the wafer.

Preferably the electrically conductive interface material 355 is between 1 and 20 mm thick, and more preferably between 1 and 10 mm thick, and has a compressibility of between 40% and 80%. Example materials include expanded graphite ribbon tape (such as provided by Yichang Xincheng Graphite Company Limited), flexible graphite foils and laminates (such as provided by SGL Group sold under the product name Sigraflex), conductive polymer plastics such as conductive nylon, polyester urethane, polyether urethane (such as provided by 3M) or conductive viscous electrolyte fluids, inks or pastes (such as provided by Dow Chemicals).

In the case of the graphite-related materials, preferably the interface material 355 has a conductivity of 300 to 1400 S/cm, and more preferably 800 to 1200 S/cm in a plane perpendicular to the axis of the compressibility. Materials having isotropic conductivity properties can also be used provided that they have sufficient compressibility to enable electrical contact to the silicon exposed in the base of grooves formed in a dielectric layer.

The electrode 305 is connected to the negative terminal of a power supply 360 which can be operated in either current-control mode or voltage-control mode. The positive terminal of the power supply is then connected to an electrode 330 (anode) that is submersed in the plating electrolyte 325. Once a voltage is applied to the two electrodes 305 and 330, the electric field between the electrodes induces a forward bias in the diode of the solar cell 110. The forward bias reduces the inbuilt potential of the diode and enables current to flow freely though the junction of the semiconductor device. Electrons are attracted to the p-type regions exposed to the electrolyte 325 through the laser-doped regions 125 of the emitter 105. This concentration of negative charges at the surface of the exposed p-type silicon regions attracts the positively-charged metal ions (e.g., copper, nickel, silver, tin or a low-melting temperature alloy such as alloys of tin with elements such as indium or bismuth, or layered combinations of these metals and/or alloys) to the surface where they are reduced to form (plated) metal deposits 100. Metal does not plate on the silicon nitride surface 130 covering the p-type emitter 105 because the silicon nitride provides an insulating barrier. To obtain the eutectic composition of an alloy such as a tin-bismuth alloy, electroplating is preferably performed at 25° C. with a current density of 20 mA/cm$^2$.

At the n-type surface, the rear aluminium electrode 115 is in electrical contact with the negative terminal of the power source 360 via the conductive interface material 355 and the electrode 305. Electrons flow into the cell via this connection thus completing the electrochemical circuit. Because the diode is forward biased by the electric field between the electrodes of the power source, once the potential barrier of the p-n junction has been exceeded, current can flow freely through the device with the effective plating current being determined by the applied potential, the bulk resistivity of the silicon wafer, the ohmic resistance of the plating electrolyte, the resistance associated with the interface between the electrode 305 and the aluminium rear surface of the cell 115, and the overpotential at the cathodic surfaces of the solar cell.

The plated low-melting temperature alloy 25 or 100 (in FIGS. 7 & 9) will form a native-grown metal oxide on the surface. The native oxide can detrimentally affect contact between the semiconductor channel 11 or 125 and the conductive busbar wire 12 because it increases the contact resistance and reduces the adhesion force. A flux, such as "no clean flux", or a mixture of isopropanol and ADIPIC Acid, may be applied on the surface of the low-melting temperature alloy 25 or 100 to remove the native-grown metal oxide. The activator in the flux may contain corrosive acids such as zinc chloride, hydrochloride acid and phosphoric acid or carboxylic acids such as glutaric acid, sebacic acid and adipic acid. The activator dissolves the metal oxide so as to improve the wettability and facilitate the reflow process. After fluxing, the low-melting temperature alloy may be reflowed at a temperature preferably in the range of 20° C. to 50° C. higher than the melting temperature of the low-temperature-melting alloy. The reflow of the low-melting temperature alloy will also serve to mix the alloy metals if the plating step does not deposit the metals uniformly. This would also permit the metals to be deposited sequentially and subsequently mixed. The reflow process may be conducted on a hotplate, or in an oven, belt furnace or rapid thermal annealing system in ambient air, nitrogen or inert gas. The time delays between the processes of plating, fluxing and reflow should be minimised to restrict excessive growth or regrowth of the native oxide.

Since conductivity from the solar cell emitter 13 to the multiple conductive busbars is provided by the semiconductor channel 11, the function of the intermediate metal layer 25 is only to provide a low resistance ohmic contact from the conductive busbar 12 to the semiconductor channel 11, and can thus be very thin. A thickness of around 1-3 micron is desirable both for a short plating time and to give good adhesion between the semiconductor channel 11 and the intermediate layer 25, and between the intermediate layer 25 and the conductive busbar wire 12.

Figure 12:
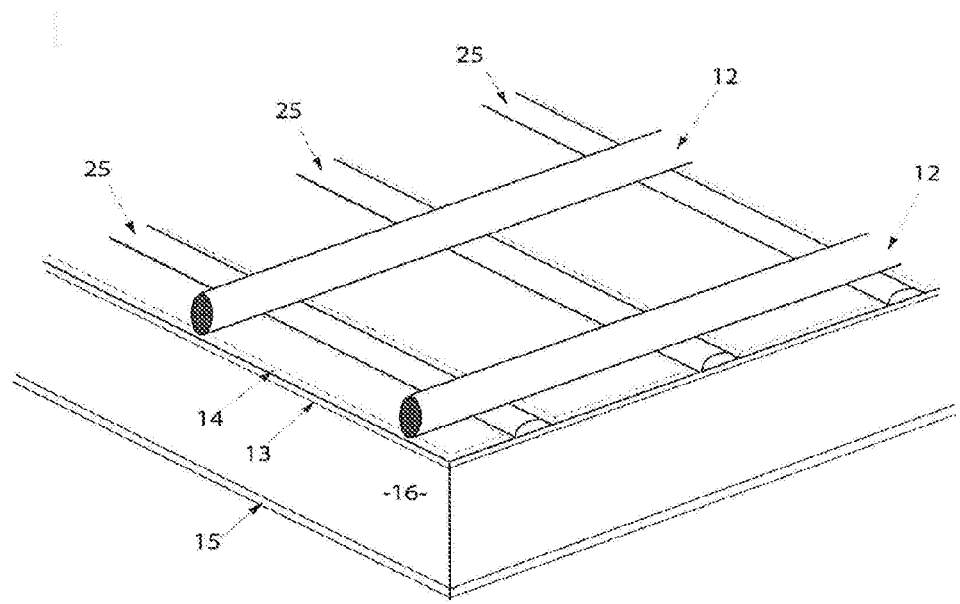
FIG. 12 diagrammatically illustrates a further alternative embodiment of an emitter contact to the arrangements of FIGS. 1 and 7.

Alternatively, the conductive channel 11 on the solar cell may be formed by simply making openings in the dielectric layer 14 via a laser, inkjet printing of etchants or other means, and plating a layer of metal 25 over the opened region, as shown in FIG. 12. This metal layer 25 again may consist of, for example, nickel, silver, tin or a low-melting temperature alloy, or layered combinations of these metals, and is again self-aligning. In this case, although conductivity from the solar cell emitter to the multiple conductive busbars 12 is provided by these plated metal regions 25, the distance between conductive busbars 12 is kept short enough so that only a small amount of plated metal is required in the metal layers 25. A thickness of around 1-3 micron is again desirable to allow a short plating time and to give good adhesion between the silicon 16 and the intermediate layer 25, and between the intermediate layer 25 and the conductive busbar wire 12, and the low-melting temperature alloy is fluxed to remove the native oxide and then reflowed at a temperature preferably in the range of 20° C. to 50° C. higher than the melting temperature of the low-melting temperature alloy.

In cases where it is desirable to plate thin (~1-3 micron) layers of metal 25 on the surface of the solar cell emitter 13, this can be a layer of a low-melting temperature alloy. This could replace the low-melting temperature alloy coating 24 on the multiple conductive busbar wires 12, or alternatively the low-melting temperature alloy could be plated on both the surface of the solar cell emitter layer 13 and on the multiple conductive busbar wires 12.

Alternatively there may be no low-melting temperature metal on either the emitter 13 or heavily doped channel 13 or on the wires 12 in which case the wires will simply contact the semiconductor surface to make electrical connection.

The various structures described above represent a new approach for forming solar cells that improves device performance by:
1. Significantly improving response to short wavelength light by reducing dopant concentration at the light receiving surface, ensuring that all carriers in close proximity to the surface are able to contribute to the device photogenerated current. This yields a significant improvement in short circuit current, typically in the vicinity of 5-10% compared to conventional screen-printed cells.
2. Reducing the device dark saturation current and therefore increasing open circuit voltage by reducing the interface area between the silicon and any metal contacting the silicon, and ensuring that the silicon is very heavily doped in these regions. This will become increasingly more important as substrate thickness continues to reduce and hence device voltages are limited more and more by surface recombination.
3. Reducing metal shading loss by removal of busbar metallisation on the cell surface and either total elimination of cell metallisation on the surface or very narrow plated metal regions and low fraction of metal coverage. This equates to higher short circuit currents for devices.
4. Improving post-processing minority carrier lifetimes for some substrate materials that degrade under the high temperatures associated with conventional screen printed solar cells. For such devices, the improved post processing material quality that comes from the lower processing temperatures leads to improvements in both currents and voltages.
5. Improving edge junction isolation through there being less unwanted diffusion into the edges of the devices that creates an unwanted conduction path between the front and rear metal contacts.
6. Reducing thermal stress on the silicon substrate through removal of the soldered interconnection process.

The described structures reduce device cost by:
1. Avoiding process steps and cost associated with front surface screen printed metallisation, and removing the cost of expensive silver thick film pastes.
2. Avoiding or drastically reducing the usage of expensive metals such as silver and copper.
3. Removing the need for nickel sintering, formation of silicide barrier layers or protective capping layers in the case where plated metallisation on the cell surface is needed, because there is no use of copper which can diffuse into the solar cell causing defects or into the module materials causing degradation.

High yield is preserved by simplifying the interconnection process of selective emitter solar cells, ensuring that perpendicular interconnection busbar wires 12 and any plated cell metallisation 25 are self-aligned, and by limiting the thickness of any plated cell metallisation to ~1-3 micron which ensures good adhesion between the silicon surface and the metallisation. Furthermore, environmental benefits are gained by elimination of lead based solders and drastic reduction in usage or elimination of lead containing thick film screen print pastes.

Methods of Implementation of Proposed Structure

While a variety of known thermal diffusion processes may be employed, in a preferred manufacturing sequence the heavily doped conductor channels 11 may be formed by coating the wafer surface with a phosphorus containing compound and then using a laser to heat the regions where the conducting channels are to be formed. The laser power is chosen so as to melt, but not significantly ablate, the underlying silicon, therefore allowing large numbers of phosphorus atoms to be released into the molten silicon which subsequently recrystallises as heavily doped n++ silicon. The laser may also be replaced with other localised heating apparatus. The phosphorus containing compound can be chosen from:

i) One of a range of commercially available spin-on or spray-on diffusion sources;
ii) Commercially available solid sources which transfer $P_2O_5$ onto the wafer surface at elevated temperature;
iii) $POCl_3$ liquid diffusion source applied by conventional techniques;
iv) A dielectric layer deposited in such a manner as to incorporate phosphorus into the layer such as silicon nitride deposited by PECVD etc.; or
v) An appropriate phosphorus containing compound such as phosphoric acid.

It is often advantageous to use the same phosphorus containing compound to first lightly diffuse the wafer top surface to the vicinity of 200 ohm/square and then subsequently use the laser as described to heat localised regions and so produce the heavily doped semiconductor channels. Such channels are typically in the range of 5-30 microns wide depending on the laser optics and laser type used. The benefit of doing the top surface diffusion first is that for some phosphorus containing compounds, the heat treatment acts to condition the layer so as to subsequently more effectively release the phosphorus when the silicon is melted by the laser. Without such appropriate conditioning/drying, some phosphorus containing compounds ablate prior to releasing sufficient phosphorus into the silicon.

Alternatively, the phosphorus dopant source may be the lightly diffused emitter itself, whereby phosphorus dopant atoms are redistributed by localised laser melting to therefore create the highly conductive channels.

Another important aspect of the laser processing in this step is that the surface passivation and phosphorus containing compound layers can be damaged in such a way as to expose regions of the silicon surface or at the very least, reduce the thickness of the surface passivation and phosphorus containing compound layers in some regions. This facilitates subsequent contact between the semiconductor channel 11 and the perpendicular busbar wire 12, and also allows self-aligned plating of very thin (~1-3 micron) layers of metal 25 to the silicon surface should there be a need for an interfacial metal layers between the semiconductor channels 11 and the perpendicular busbar wire 12.

Example of a Manufacturing Process Using the Invention
1) Saw damage removal by etching the surface of the wafer 16 (standard commercial process)
2) Texturing the surface of the wafer 16 (standard commercial process)
3) Cleaning of the surfaces of the wafer 16 (standard commercial process)
4) Diffusion of emitter layer 13 on a top (i.e. front) surface of the wafer 16 to about 200 ohms/square using a inline belt furnace process or quartz tube furnace (standard commercial process)
5) Phospho-silicate glass removal and edge junction isolation (standard commercial process)
6) Deposition of silicon nitride passivation and antireflection layer 14 (standard commercial process)
7) Screen print a rear aluminium metal contact 15 and dry (standard commercial process)
8) Fire rear contacts 15 (standard commercial process)
9) Application of phosphorus containing compound on front surface for use as selective dopant source (not shown)
10) Melting of local silicon regions with a laser 18 so as to laser dope the heavily doped semiconductor channels 11 which are spaced approximately 1 mm apart across the entire front surface of the wafer 16.
11) Attachment of busbar interconnection wires 12 oriented perpendicularly to the channels 11 to interconnect one channel to the next and to provide connection points for interconnection of the cell to an adjacent cell.

As described above, 8 of 11 processing steps closely resemble standard commercial processes used by manufacturers in the fabrication of conventional screen printed solar cells. There are however many variations that can be used to achieve the proposed structure. A common variation to reduce cost is to eliminate the dopant source in step 9 or replace it with an antireflection coating such as silicon nitride that is either deposited containing phosphorus to enable it to act as a diffusion source or else is deposited onto a thin phosphorus containing compound/layer such as $P_2O_5$. In either case, step 10 above is subsequently used as described to form the semiconductor channels. Regardless of the dopant source, it is important in step 10 for the silicon to be heated by the laser or other heat source to above the silicon melting temperature of about 1400° C. This not only facilitates more phosphorus dopants penetrating deep into the silicon, but it also damages the overlying dielectric layer thereby facilitating better subsequent electrical contact between the busbar wires 12 and the semiconductor channels 11 within the silicon.

FIG. 1 shows detail of the surface of a textured silicon wafer 16 that has been lightly diffused to 200 ohms/square to form the emitter 13 and then coated with a dielectric passivation/antireflection layer 14. The semiconductor channels 11 are then formed parallel to each other with a spacing of around 1 mm using laser or other local heating method. The perpendicular busbar wires 12 form a contact with the silicon wherever they cross the semiconductor channels 11 but remain relatively isolated from the silicon in all the other surface regions where the surface dielectric layer 14 remains intact.

Referring to FIG. 7, if an interfacial layer of very thin plated metal 25 should be needed between the perpendicular busbar wire 12 and the semiconductor channels 11 within the silicon, for reasons of reliability or reduced contact resistance, then the step to apply the metal layers 25 can be inserted between steps 10 and 11 in the above example manufacturing process. This intermediate layer may consist of, for example, nickel, silver, tin or a low-melting temperature alloy, or layered combinations of these metals. If the intermediate metal layer 25 consists of a low-melting temperature alloy, it may be fluxed to remove its native oxide and then reflowed at a temperature preferably in the range of 20° C. to 50° C. higher than the melting temperature of the low-melting temperature alloy. The function of the intermediate metal layers 25 is only to provide a low resistance ohmic contact from the conductive busbar 12 to the semiconductor channel 11, and can thus be very thin. A thickness of around 1-3 micron is desirable both for a short plating time and to give good adhesion between the semiconductor channel 11 and the intermediate layer 25, and between the intermediate layer 25 and the conductive busbar wire 12. Alternatively, the intermediate metal 25 may form the conductive channels on the surface of the silicon wafer as shown in FIG. 12 instead of heavily doped semiconductor channels 11. This eliminates step 9 in the above processing sequence. Although the intermediate layer 25 now has to also serve as a charge transport layer, the plated layer can still be very thin since distances to the closest perpendicular busbar wire are very short (several millimeters). In plating any intermediate metal layers 25, the avoidance of the use of copper will eliminate the need for formation of barrier layers or sintered silicides.

Figure 13:
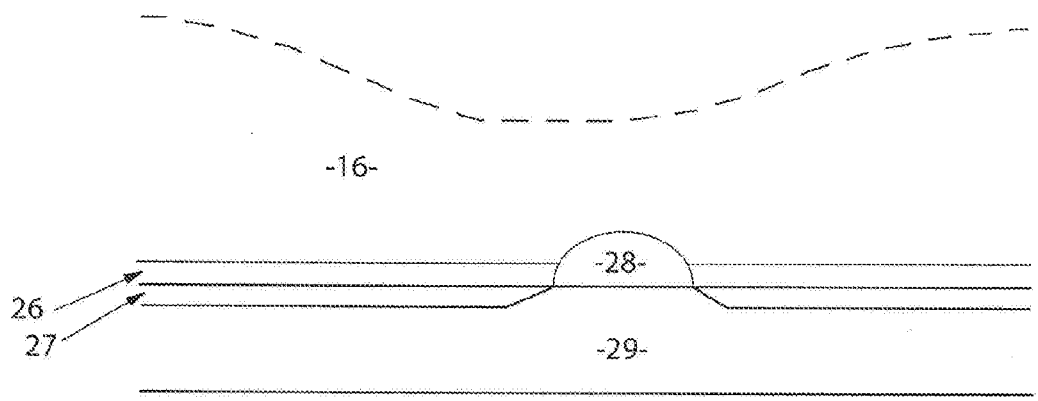
FIG. 13 diagrammatically illustrates a contact structure embodiment applied to a rear surface contact.

Referring to FIG. 13, another possible variation over conventional screen printed cells is to also apply the same contact technology to the rear surface of the wafer so as to improve the effective rear surface passivation while also making possible the production of a bifacial cell that can receive light entering the rear surface. In applying the proposed contact structure to the rear surface of the wafer, the polarity of dopants used for laser doping of the rear contact heavily doped semiconductor regions 28 is opposite to the polarity used for the front surface heavily doped semiconductor regions 11. The use of a diffused back surface field layer 26 is optional. In FIG. 13 it can be seen that by applying a p-type dopant source layer, conductive channels, points, dashes or donuts 28 can be formed by melting of the underlying silicon in a similar manner to that described above for the front surface case. This avoids having the entire back surface heavily doped while providing high conductivity paths to the rear perpendicular busbar wires 29 and good passivation via correct selection of the passivating layer 27, which may also act as a dopant source. If the heavily doped semiconductor regions 28 are shaped as elongate channels (i.e. similarly structured to the front surface contacts illustrated in FIG. 7), or intermittent short channels (or "Dashes"—see FIG. 15), the busbar wires 29 will typically be located substantially perpendicularly to the channels 28. The rear surface is thus not completely covered in metal, enabling the possibility of rear illumination of the cell.

Figure 14:
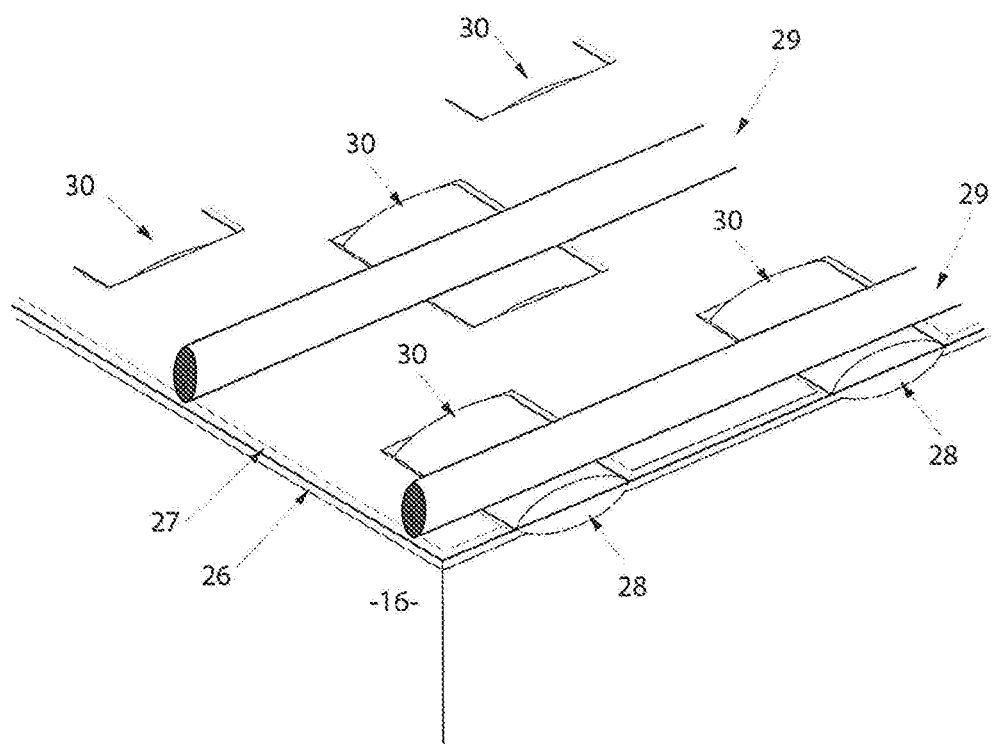
FIG. 14 diagrammatically illustrates an alternative embodiment of a rear surface contact.

Referring to FIG. 14, the heavily doped semiconductor regions 28 of the rear contacts may be in the shape of point contacts (square shaped pads) as illustrated. The heavily doped semiconductor regions 28 may also be plated with metal pads 30 in a similar manner to the front surface embodiment described with reference to FIG. 7. The metal pads 30 may comprise, for example, nickel, silver, tin or a low-melting temperature alloy, or layered combinations of these metals, preferably with a final layer of low-melting temperature alloy. Alternatively the heavily doped semiconductor regions 28 may be dispensed with and the metal pads may be formed directly onto the semiconductor material of the substrate 16 (not illustrated) as for the case where the front surface contact metal 25 is deposited directly onto the emitter 13 (see FIG. 12). Similarly, a rear contact structure similar to the front contact structure of FIG. 1 may also be used, where the metal layers 30 are omitted and the wires 29 contact directly onto the heavily doped regions 28. As with the emitter contact examples the substrate 16 may be exposed by etching a pattern of openings in the dielectric layer 27 through which doping of the substrate 16 to form the heavily doped regions 28 and/or plating onto the substrate 16 or heavily doped region 28 takes place. Examples of metal or metal alloys that have sufficiently low melting temperatures include alloys of tin with elements such as indium or bismuth. The melting temperature of the alloy can be minimized by selecting a metal composition ratio corresponding to the eutectic composition, at which the alloy has the lowest melting temperature. If a low-melting temperature alloy is used, it may be fluxed to remove its native oxide and then reflowed at a temperature preferably in the range of 20° C. to 50° C. higher than the melting temperature of the low-melting temperature alloy to give good electrical contact and adhesion.

Figure 15:
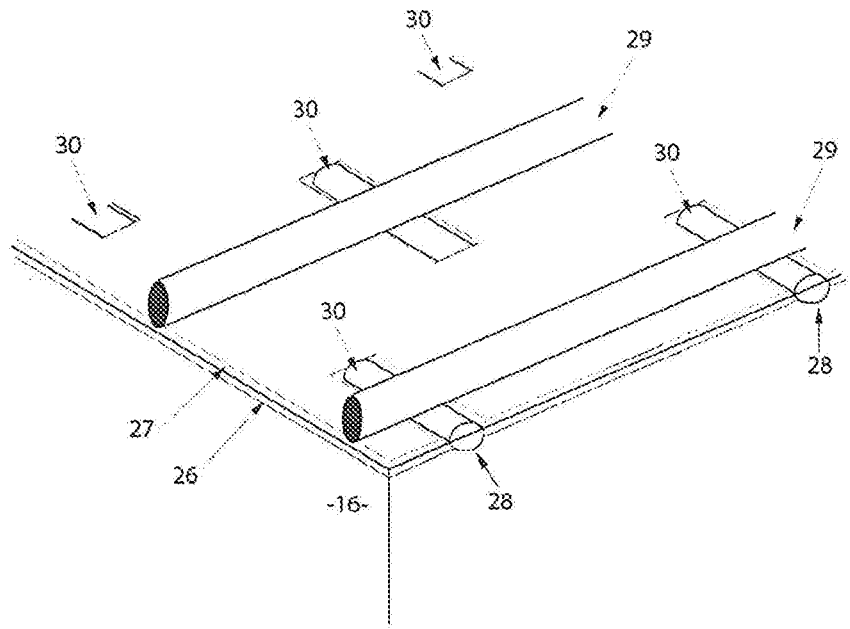
FIG. 15 diagrammatically illustrates another alternative embodiment of a rear surface contact to the arrangements of FIG. 14.
Figure 16:
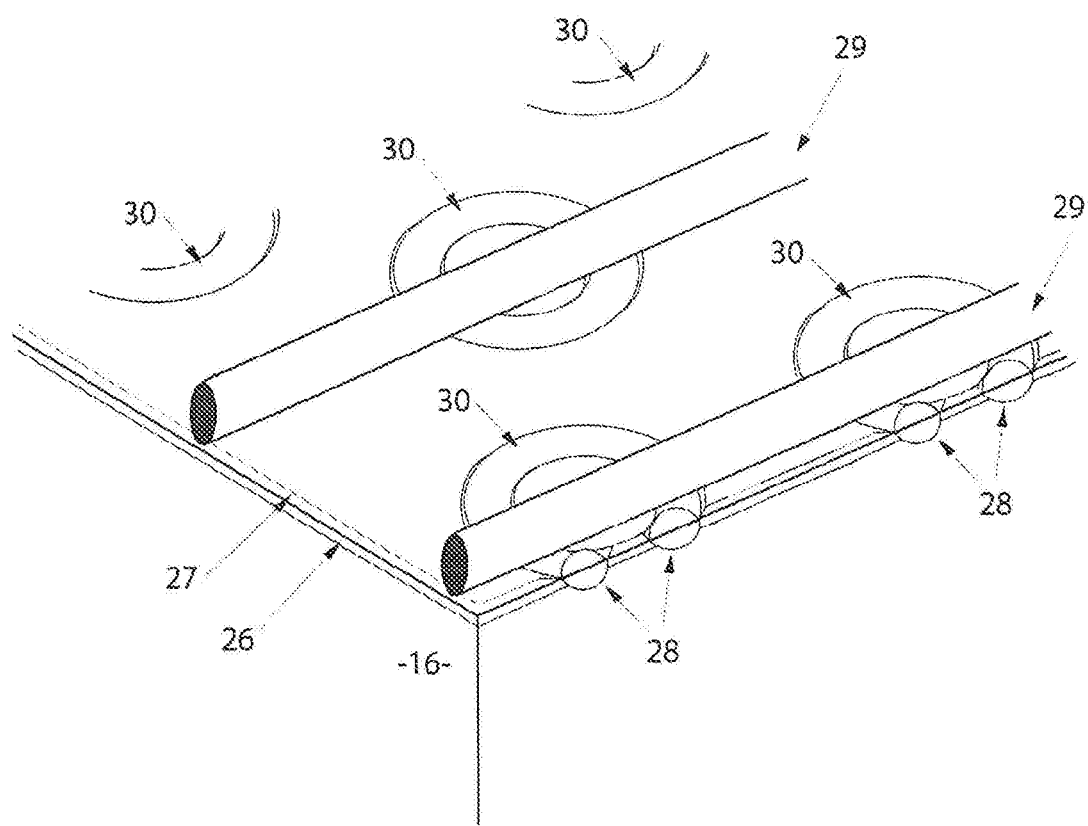
FIG. 16 diagrammatically illustrates another alternative embodiment of a rear surface contact to the arrangements of FIG. 14 or 15.

FIGS. 15 & 16 show embodiments of rear contacts with different shaped contact structures. FIG. 15 shows a structure similar to that of the contact illustrated in FIG. 14 except that the contact areas are shaped as intermittent short channels. FIG. 13 shows a structure similar to that of the contact illustrated in FIG. 14 except that the contact areas are donut shaped.

Rear contact shapes and structures similar to those of FIGS. 14, 15 & 16 having other combinations of contact structure beyond those illustrated (i.e. absence or presence of surface metallisation and absence or presence of heavily doped channels) are also possible.

Other permutations of front contact shapes and structures are possible, such as structures similar to those of FIGS. 1, 7 & 12 combined with contact shapes such as the rear contact shapes shown in FIGS. 14, 15 & 16.

The novel cell designs above have been described for n-type emitters and p-type substrates. The contact structure could be equally well implemented in the reverse polarities using an n-type substrate 16 with boron-doped p-type emitter 13, p-type front surface heavily doped semiconductor channels 11 and n-type rear surface semiconductor channels 28.

Figure 17:
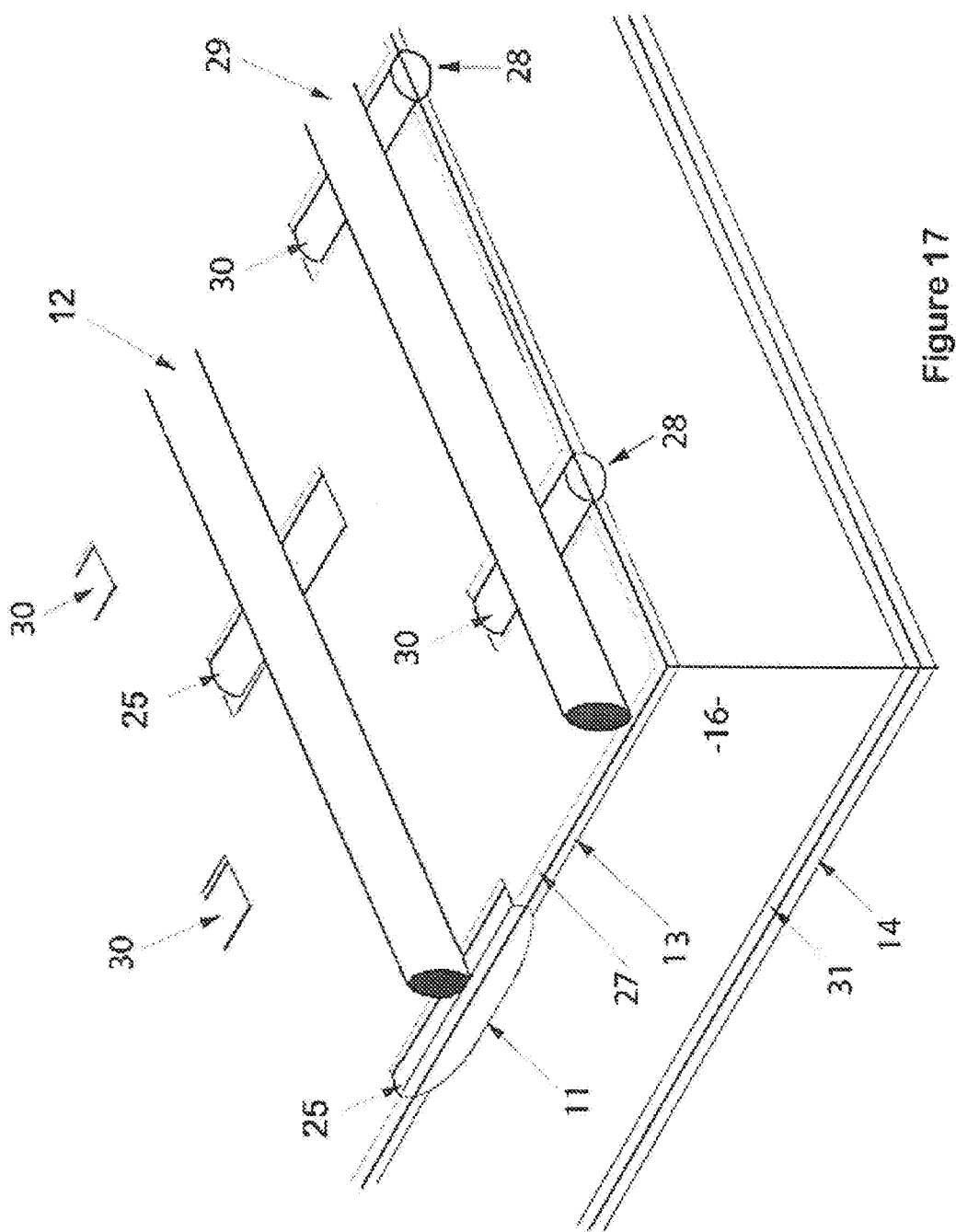
FIG. 17 diagrammatically illustrates a further alternative embodiment in which the p-type and n-type contacts are all placed on the rear surface of the cell.

Referring to FIG. 17 another possible variation over conventional screen printed cells is to also apply a similar contact technology for both the negative and positive contacts to the rear surface of the wafer so as to improve the effective rear surface passivation and eliminate shading losses at the front surface. In applying the proposed contact structure to the rear surface of the wafer, the polarity of dopants used for laser doping of the rear p-type contact heavily doped semiconductor regions 28 is opposite to the polarity used for the rear n-type contact heavily doped semiconductor regions 11. The use of a diffused rear surface emitter layer 13 is optional. It can be seen that by applying an n-type dopant source layer, conductive channels, points, dashes or donuts 11 can be formed by melting of the underlying silicon in a similar manner to that described above for the front surface case. This avoids having the entire back surface heavily doped while providing high conductivity paths from the emitter 13 to the rear perpendicular busbar wires 12 and good passivation via correct selection of the passivating layer 27. Similarly, by applying a p-type dopant source layer, conductive channels, points, dashes or donuts 28 can be formed by melting of the underlying silicon in a similar manner to that described above for the front surface case, whereby the resulting p-type doped region penetrates the emitter layer 13 and provides a high conductivity path from the base substrate 16 to the rear perpendicular busbar wires 29. The heavily doped n-type semiconductor region 11 may also be plated with metal pads 25 and the heavily doped p-type semiconductor region 28 may also be plated with metal pads 30, in a similar manner to the embodiments described above. The front surface is coated with a dielectric passivation/antireflection layer 14. The use of a front floating junction layer 31 is optional.

Figure 18:
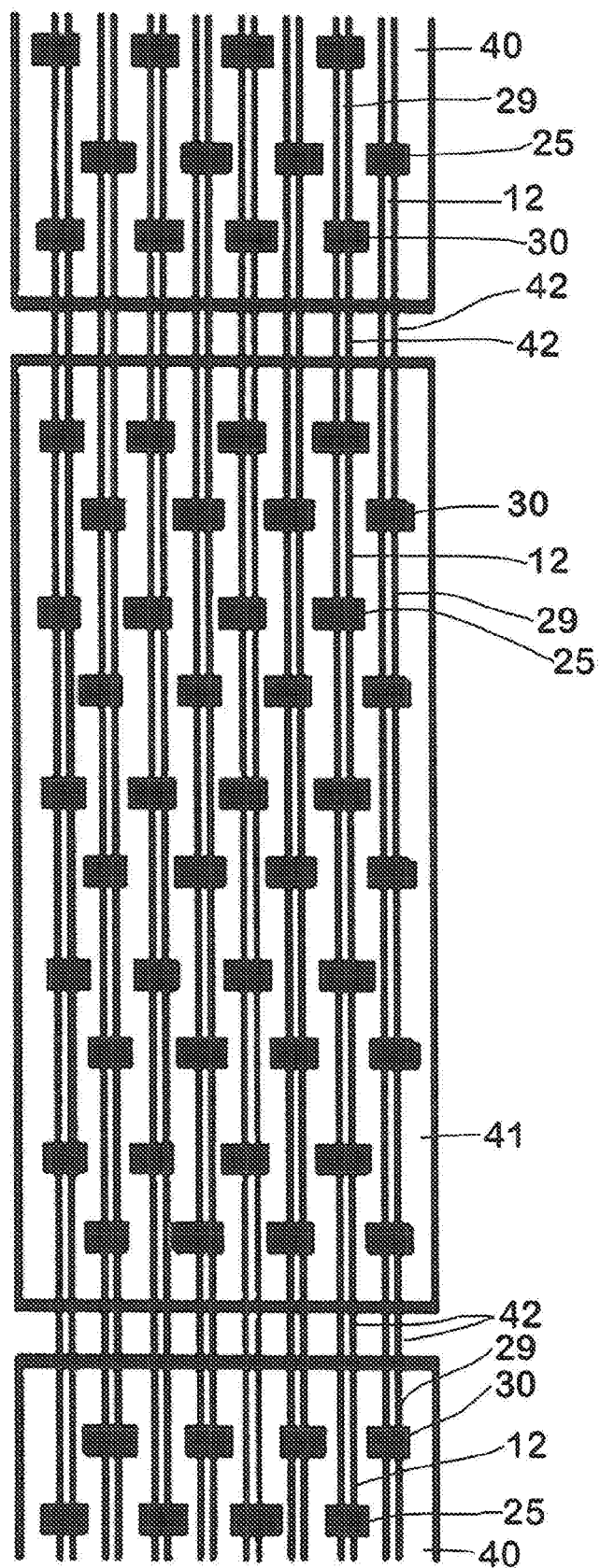
FIG. 18 diagrammatically illustrates a plurality of cells connected in series, where the n-type and p-type contacts of each cell are all on the same surface in a configuration similar to that shown in FIG. 17 and cells are interconnected by straight wires.

FIG. 18 shows a plurality of cells connected in series, where the contacts of each cell are all on the rear surface (facing out of the page in FIG. 18) in a configuration similar to that shown in FIG. 17. By alternating the n-type and p-type contacts and having an equal number of rows and columns of each, it is possible to rotate every second cell such that the n-type contacts 25 of one cell 40 are aligned with the p-type contacts of the adjacent cell 41, such that a series of straight parallel wires 42 act as the interconnecting wires 12 & 29 respectively (as seen in FIG. 17) to provide interconnection of the contacts within each cell and also provide the series connections between cells by connecting the n-type contacts of one cell 40 to the p-type contacts of the adjacent cell 41.

It will be appreciated by persons skilled in the art that numerous variations and/or modifications may be made to the above-described embodiments, without departing from the broad general scope of the present disclosure. The present embodiments are, therefore, to be considered in all respects as illustrative and not restrictive.

The invention claimed is:

1. A method of forming a contact structure on a solar cell having a p-n junction formed between a first semiconductor region of a first dopant polarity and a second semiconductor region of a second dopant polarity opposite to the first dopant polarity, the first semiconductor region having a textured surface, the method comprising:
forming a textured dielectric surface having a plurality of peaks by coating the textured surface with a dielectric layer;
forming openings in the dielectric layer to expose areas of the first semiconductor region;
forming a plurality of discrete heavily doped regions of the first dopant polarity at the openings extending from the surface of the solar cell into the first semiconductor region;
forming a plurality of discrete first contact points on a surface of the solar cell, the contact points comprising first metal pads having a thickness of less than 5 microns over the discrete heavily doped regions to provide an electrical connection to the first semiconductor region, a top surface of the first metal pads being lower than a highest peak of the plurality of peaks of the textured dielectric surface; and
locating a plurality of first conducting wires over the solar cell whereby each of the conducting wires makes contact with and electrically connects to at least one of the first metal pads.

2. The method as claimed in claim 1 wherein forming the discrete heavily doped regions comprises forming regions with a sheet resistance of 1 to 50 ohms/square.

3. The method as claimed in claim 1 wherein the discrete heavily doped regions are circular, oval, square, rectangular or polygonal in shape.

4. The method as claimed in claim 1 wherein the first contact points have dimensions in the plane of the surface of the solar cell in the range of 8-12 microns.

5. The method as claimed in claim 1 wherein the first contact points comprise elongate parallel sided regions.

6. The method as claimed in claim 5 wherein the elongate parallel sided regions have a width in the range of 8-12 microns.

7. The method as claimed in claim 1 wherein the first metal pads are isolated from the remainder of the first semiconductor region by the dielectric layer.

8. The method as claimed in claim 1 wherein the first metal pads are formed by plating onto the heavily doped regions.

9. The method as claimed in claim 1 comprising forming the discrete heavily doped regions by providing a dopant source on or near the surface of the solar cell and laser heating the dopant source and the first semiconductor region in a pattern corresponding to the locations of the discrete heavily doped regions to cause dopants from the dopant source to dope the discrete heavily doped regions to the required concentration, while simultaneously disrupting the dielectric layer forming openings in the dielectric layer to expose surfaces of the resultant heavily doped regions.

10. The method as claimed in claim 8 comprising forming each of the first metal pads by plating a layer or layers of nickel, silver and/or tin onto the exposed first semiconductor regions.

11. The method as claimed in claim 1 comprising forming the first semiconductor region with a sheet resistance of 80 to 200 ohms/square.

12. The method as claimed in claim 1 comprising attaching the first conducting wires to a sheet of encapsulant and applying the first conducting wires to the surface of the solar cell together with the encapsulant.

13. The method as claimed in claim 1, further comprising bonding an encapsulant layer over a surface of the solar cell and the plurality of first conducting wires.

14. The method as claimed in claim 1 wherein the plurality of first conducting wires are coated with a low-melting temperature metal.

15. The method of claim 14 comprising heating the coated metal wires to a temperature 20° C. to 50° C. higher than the melting temperature of the low-melting point metal to reflow the low-melting temperature metal layer to bond the metal-coated first conducting wires to the first metal pads.

16. The method as claimed in claim 1 further comprising:
forming a plurality of second contact points whereby the second contact points provide an electrical connection to the second semiconductor region and are silicon surfaces over which second metal pads having a thickness of less than 5 microns are formed.

17. The method as claimed in claim 16 wherein the plurality of second contact points are located on the same surface of the solar cell as the first contact points.

18. The method as claimed in claim 16 further comprising:
locating the solar cell in a linear array of like solar cells, the first contact points of one solar cell of the array each aligned with respective second contact points of solar cells adjacent to the one solar cell;
locating a plurality of first conducting wires to extend over the array of solar cells, whereby each of the first conducting wires is located to pass over the first contact points of the one solar cell to make electrical connection to at least one of the first contact points of the one solar cell and every alternate solar cell in the array relative to the one solar cell;
locating a plurality of second conducting wires to extend over the array of solar cells, whereby each of the second conducting wires is located to pass over the second contact points of the one solar cell to make electrical connection to one or more of the second contact points of the one solar cell and every alternate solar cell in the array relative to the one solar cell;
wherein the first conducting wires of the one solar cell comprise the second conducting wires of the solar cells adjacent to the one solar cell and every alternate solar cell in the array relative to the adjacent solar cells and the second wires of the one solar cell comprise the first conducting wires of the adjacent solar cells and every alternate solar cell in the array relative to the adjacent solar cells.

19. The method as claimed in claim 18 wherein the plurality of second contact points are located on the same surface of the solar cell as the first contact points.

20. The method as claimed in claim 16 wherein the plurality of second contact points are located on the same surface of the solar cell as the first contact points the method further comprising:

locating the solar cell in a linear array of like solar cells, the first contact points of one solar cell of the array each aligned with respective second contact points of solar cells adjacent to the one solar cell;

attaching the plurality of first conducting wires in parallel to a sheet of encapsulant attaching a plurality of second conducting wires to the sheet of encapsulant, parallel to the first conducting wires and alternating therewith;

applying the first and second conducting wires over the surface of the solar cell together with the encapsulant, whereby;

the plurality of first conducting wires extend over the array of solar cells, with each of the first conducting wires located to pass over the first contact points of the one solar cell to make electrical connection to at least one of the first contact points of the one solar cell and every alternate solar cell in the array relative to the one solar cell;

the plurality of second conducting wires extend over the array of solar cells, with each of the second conducting wires located to pass over the second contact points of the one solar cell to make electrical connection to one or more of the second contact points of the one solar cell and every alternate solar cell in the array relative to the one solar cell; and the first conducting wires of the one solar cell comprise the second conducting wires of the solar cells adjacent to the one solar cell and every alternate solar cell in the array relative to the adjacent solar cells and the second wires of the one solar cell comprise the first conducting wires of the adjacent solar cells and every alternate solar cell in the array relative to the adjacent solar cells.

21. The method as claimed in claim 16 further comprising:

locating the solar cell in a linear array of like solar cells, the first contact points of one solar cell of the array each aligned with respective second contact points of solar cells adjacent to the one solar cell;

attaching the plurality of first conducting wires in parallel to a sheet of encapsulant;

applying the first conducting wires over the surface of the solar cell on which the first contact points are formed, together with the encapsulant, whereby;

the plurality of first conducting wires extend over the array of solar cells, with each of the first conducting wires located to pass over the first contact points of the one solar cell to make electrical connection to at least one of the first contact points of the one solar cell and every alternate solar cell in the array relative to the one solar cell;

attaching a plurality of second conducting wires to a further sheet of encapsulant;

applying the second conducting wires and the encapsulant over the surface of the solar cell on which the first contact points are formed, together with the encapsulant, whereby;

the plurality of second conducting wires extend over the array of solar cells, with each of the second conducting wires located to pass over the second contact points of the one solar cell to make electrical connection to one or more of the second contact points of the one solar cell and every alternate solar cell in the array relative to the one solar cell; and the first conducting wires of the one solar cell comprise the second conducting wires of the solar cells adjacent to the one solar cell and every alternate solar cell in the array relative to the adjacent solar cells and the second wires of the one solar cell comprise the first conducting wires of the adjacent solar cells and every alternate solar cell in the array relative to the adjacent solar cells.

22. The method as claimed in claim 1, further including bonding an encapsulant layer over a surface of the solar cell and the first conducting wires.

23. The method as claimed in claim 21 comprising placing the first conducting wires on the surface of the solar cell before encapsulating the solar cell.

24. The method as claimed in claim 12 comprising forming the first conducting wires by printing a metal seed layer onto the sheet of encapsulant and plating metal onto the metal seed layer to create a wire of a required cross-sectional area.

* * * * *